US009034560B2

(12) United States Patent
Shirakawa et al.

(10) Patent No.: US 9,034,560 B2
(45) Date of Patent: May 19, 2015

(54) NEGATIVE RESIST COMPOSITION AND PATTERN FORMING METHOD USING THE SAME

(71) Applicant: FUJIFILM Corporation, Minato-Ku, Tokyo (JP)

(72) Inventors: Koji Shirakawa, Shizuoka (JP); Tadateru Yatsuo, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/255,113

(22) Filed: Apr. 17, 2014

(65) Prior Publication Data

US 2014/0227642 A1    Aug. 14, 2014

Related U.S. Application Data

(62) Division of application No. 12/058,329, filed on Mar. 28, 2008, now abandoned.

(30) Foreign Application Priority Data

Mar. 29, 2007  (JP) ................................. 2007-088557
Mar. 25, 2008  (JP) ................................. 2008-079338

(51) Int. Cl.
| | | |
|---|---|---|
| G03F 7/004 | (2006.01) | |
| G03F 7/20 | (2006.01) | |
| G03F 7/40 | (2006.01) | |
| G03F 7/11 | (2006.01) | |
| H01L 21/027 | (2006.01) | |
| H01L 21/32 | (2006.01) | |
| H01L 21/311 | (2006.01) | |
| C09D 125/18 | (2006.01) | |
| G03F 7/038 | (2006.01) | |

(52) U.S. Cl.
CPC .............. *G03F 7/11* (2013.01); *H01L 21/0274* (2013.01); *H01L 21/32* (2013.01); *H01L 21/31144* (2013.01); *C09D 125/18* (2013.01); *G03F 7/0382* (2013.01); *Y10S 430/143* (2013.01)

(58) Field of Classification Search
CPC ........... G03F 1/08; G03F 1/30; G03F 7/0382; G03F 7/11; H01L 21/00; H01L 21/02; H01L 21/0274; H01L 21/32; H01L 21/31144; C09D 125/18
USPC .................. 430/5, 311, 322, 275.1, 396, 296
See application file for complete search history.

(56) References Cited

U.S. PATENT DOCUMENTS

| | | | |
|---|---|---|---|
| 6,071,670 A | 6/2000 | Ushirogouchi et al. | |
| 6,171,749 B1 | 1/2001 | Tachikawa et al. | |
| 6,653,052 B2 * | 11/2003 | Tanaka et al. ................. | 430/311 |
| 2002/0192592 A1 | 12/2002 | Yasunami et al. | |
| 2003/0124456 A1 * | 7/2003 | Shirakawa et al. ........ | 430/270.1 |
| 2003/0235781 A1 * | 12/2003 | Shida et al. ................ | 430/270.1 |
| 2004/0063002 A1 * | 4/2004 | Wu et al. ............................ | 430/5 |
| 2004/0166432 A1 | 8/2004 | Ohsawa et al. | |
| 2005/0038261 A1 | 2/2005 | Maesawa et al. | |
| 2005/0196164 A1 | 9/2005 | Sasayama | |
| 2006/0210919 A1 | 9/2006 | Mizutani et al. | |
| 2007/0077512 A1 | 4/2007 | Watanabe et al. | |
| 2010/0143831 A1 | 6/2010 | Yoshikawa et al. | |

FOREIGN PATENT DOCUMENTS

| | | |
|---|---|---|
| EP | 1666968 A1 | 6/2006 |
| JP | 4-51243 A | 2/1992 |
| JP | 8-110638 A | 4/1996 |
| JP | 10-186660 A | 7/1998 |
| JP | 11-149159 A | 6/1999 |
| JP | 2003-295439 A | 10/2003 |
| JP | 2006-078807 A | 3/2006 |
| KR | 20020075264 A | 10/2002 |
| KR | 10-2004-0063156 A | 7/2004 |
| KR | 20040063156 A | 7/2004 |

OTHER PUBLICATIONS

Communication issued Mar. 30, 2014, in corresponding Korean Application No. 10-2014-0025861.
Extended European Search Report dated Sep. 3, 2008.
Korean Office Action issued on Jul. 15, 2013 by the Korean Property Office in corresponding Korean Patent Application No. 10-2008-0029054.
Korean Office Action issued on Nov. 15, 2013 by the Korean Intellectual Property Office in a counterpart Application No. 10-2008-0029054.
Communication issued by the Korean Intellectual Property Office, dated Oct. 27, 2014, in counterpart Korean Application No. 10-2014-0025861.

\* cited by examiner

*Primary Examiner* — Amanda C Walke
(74) *Attorney, Agent, or Firm* — Sughrue Mion, PLLC

(57) ABSTRACT

A negative resist composition, includes: (A) an alkali-soluble polymer containing a specific repeating unit as defined in the specification; (B) a crosslinking agent capable of crosslinking with the alkali soluble polymer (A) under an action of an acid; (C) a compound capable of generating an acid upon irradiation with actinic rays or radiation; (D) a specific quaternary ammonium salt as defined in the specification; and (E) an organic carboxylic acid, and a pattern forming method uses the composition.

13 Claims, No Drawings

NEGATIVE RESIST COMPOSITION AND PATTERN FORMING METHOD USING THE SAME

CROSS-REFERENCE TO RELATED APPLICATIONS

This is a divisional of application Ser. No. 12/058,329, filed Mar. 28, 2008, which claims priority from Japanese Patent Application No. 2007-088557, filed Mar. 29, 2007, and Japanese Patent Application No. 2008-079338, filed Mar. 25, 2008, all of which are incorporated by reference herein.

BACKGROUND OF THE INVENTION

1. Field of the Invention

The present invention relates to a negative resist composition suitably usable for the ultramicrolithography process such as production of VLSI or a high-capacity microchip or in other fabrication processes, and a pattern forming method using the same. More specifically, the present invention relates to a negative resist composition capable of forming a high-resolution pattern by using electron beam or X-ray, and a pattern forming method using the same. That is, the present invention relates to a negative resist composition for use in the process using a substrate having thereon a specific underlying film.

2. Description of the Related Art

In the process of producing a semiconductor device such as IC and LSI, fine processing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam or X-ray is proceeding.

In particular, the electron beam lithography is positioned as a next-generation or next-next-generation pattern formation technique and a negative resist assured of high sensitivity and high resolution is being demanded.

Also, the electron beam lithography is widely used for the preparation of a photomask employed in the semiconductor exposure because of its high resolution property. The process of preparing a photomask is as follows. A shielding layer mainly comprising a shielding material such as chromium is provided on a transparent substrate such as glass substrate to prepare a shielding substrate, and a resist layer is formed thereon and selectively exposed to form a resist pattern on the shielding layer. Subsequently, the shielding layer in the portion where the pattern is not formed is etched using the resist pattern as a mask to transfer the pattern to the shielding layer, whereby a photomask comprising a transparent substrate having provided thereon a shielding layer in a predetermined pattern can be obtained.

In the processing using an electron beam, which is a different system from the block exposure of light, elevation of sensitivity is very important for reducing the processing time, but in the case of a negative resist for use with an electron beam, when higher sensitivity is pursued, the line edge roughness is worsened in addition to reduction of the resolution and deterioration of the pattern profile, and a resist capable of satisfying these properties all at the same time is strongly demanded. The line edge roughness as used herein means that the resist edge at the interface between the pattern and the substrate irregularly fluctuates in the direction perpendicular to the line direction due to the resist characteristics and when the pattern is viewed from right above, the edge gives an uneven appearance. This unevenness is transferred by the etching step using the resist as a mask and impairs the dimensional precision. Particularly, in the ultrafine region of 0.25 µm or less, the line edge roughness is a very important problem to be solved.

Also, it is known that when a resist pattern is formed on the shielding layer used for the preparation of a photomask, deterioration of the pattern profile is brought about. In particular, when a negative resist is used, pattern collapse occurs due to erosion at the interface with the substrate, giving rise to an issue that the resolving power significantly deteriorates, and this becomes a problem.

The high sensitivity is in a trade-off relationship with high resolution, good pattern profile and good line edge roughness and it is very important how to satisfy these properties all at the same time.

As regards the resist suitable for the electron beam or X-ray lithography process, a chemical amplification-type resist utilizing an acid catalytic reaction is mainly used in view of high sensitivity and in the case of a negative resist, a chemical amplification-type resist composition mainly comprising an alkali-soluble resin, a crosslinking agent, an acid generator and an additive is being effectively used.

Various studies have been heretofore made to enhance the performance of the chemical amplification-type negative resist. The following studies have been made on the additive, particularly, the ammonium salt-type additive. For example, JP-A-4-51243 discloses a combination of a tetraalkylammonium salt and a novolak resin, JP-A-8-110638 discloses a trialkylammonium hydroxide, and JP-A-11-149159 discloses a combination of a tetraalkylammoinum salt and a polymer having a carboxylic acid in the side chain.

However, it is impossible by any combination of these conventionally known compounds to satisfy high sensitivity, high resolution, good pattern profile, good line edge roughness, and good in-vacuum PED characteristic in an ultrafine region all at the same time.

Also, in JP-A-10-186660, use of an organic carboxylic acid is studied, but use of a specific resin and a specific ammonium salt is not described. Furthermore, JPA-2003-295439 sets forth use of an ammonium salt but is silent on use of an organic carboxylic acid. In addition, neither of these patent publications refers to improving the line edge roughness while giving a good pattern profile with less erosion, which is the effect of the present invention.

SUMMARY OF THE INVENTION

An object of the present invention is to solve the problems in the technique of enhancing performances at the fine processing of a semiconductor device or a photomask and provide a negative resist composition satisfying high sensitivity, high resolution, good pattern profile, good line edge roughness and good in-vacuum PED characteristic all at the same time particularly in the fine processing of a semiconductor or a photomask, where electron beam or X-ray is used, and a pattern forming method using the composition.

As a result of intensive studies, the present inventors have found that the object of the present invention can be attained by a negative resist composition using an alkali-soluble resin with a specific structure, a crosslinking agent, an acid generator, an ammonium salt with a specific structure, and an organic carboxylic acid.

That is, the present invention is as follows.

(1) A negative resist composition, comprising:

(A) an alkali-soluble polymer containing a repeating unit represented by formula (1);

(B) a crosslinking agent capable of crosslinking with the alkali soluble polymer (A) under an action of an acid;

(C) a compound capable of generating an acid upon irradiation with actinic rays or radiation;

(D) a quaternary ammonium salt represented by formula (2); and (E) an organic carboxylic acid:

Formula (1)

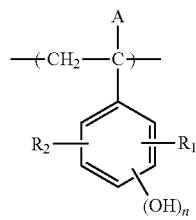

wherein A represents a hydrogen atom, an alkyl group, a halogen atom or a cyano group;

$R_1$ and $R_2$ each independently represents a hydrogen atom, a halogen atom, an alkyl group, an alkenyl group, a cycloalkyl group, an aryl group, an aralkyl group, an alkoxy group or an alkylcarbonyloxy group; and n represents an integer of 1 to 3;

Formula (2)

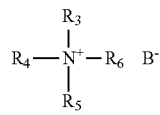

wherein $R_3$ to $R_6$ each independently represents an alkyl group, an alkenyl group, an aryl group or an aralkyl group;

$B^-$ represents an $OH^{31}$ group, a halogen atom, an $R_7$—$CO_2^-$ group or an $R_7$—$SO_3^-$ group; and $R_7$ represents an alkyl group, an alkenyl group, an aryl group or an aralkyl group.

(2) The negative resist composition as described in (1) above, wherein the crosslinking agent (B) is a phenol compound having two or more benzene rings within a molecular thereof and not containing a nitrogen atom.

(3) A pattern forming method, comprising:

forming a resist film from the negative resist composition as described in (1) or (2) above; and exposing and developing the resist film.

Furthermore, preferred embodiments of the present invention are set forth below.

(4) The negative resist composition as described in (1) or (2) above, wherein the alkali-soluble polymer (A) further contains at least one repeating unit selected from the repeating units represented by formulae (3), (4) and (5):

Formula (3)

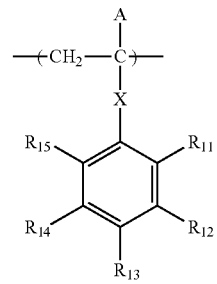

Formula (4)

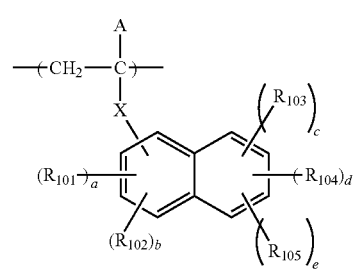

Formula (5)

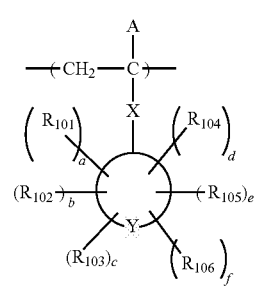

represents any group selected from the following structures:

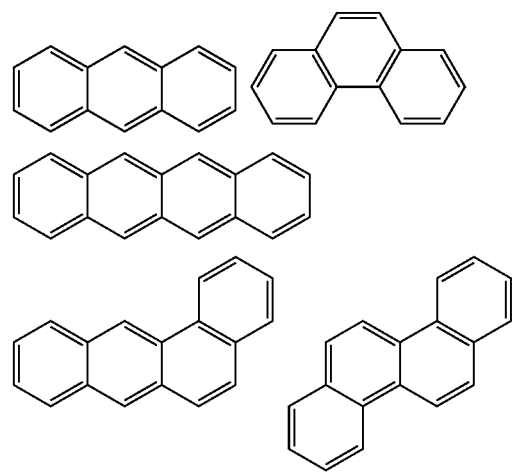

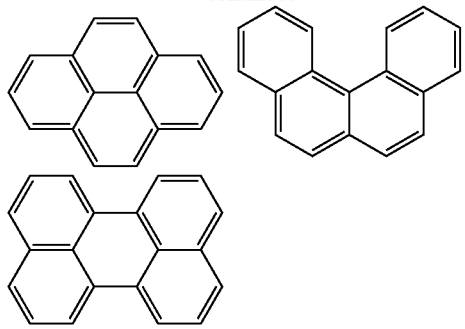

wherein A has the same meaning as A in formula (1);

X represents a single bond, a —COO— group, an —O— group or a —CON($R_{16}$)— group;

$R_{16}$ represents a hydrogen atom or an alkyl group;

$R_{11}$ to $R_{15}$ each independently has the same meaning as $R_1$ in formula (1);

$R_{101}$ to $R_{106}$ each independently represents a hydroxy group, a halogen atom, an alkyl group, an alkoxy group, an alkylcarbonyloxy group, an alkylsulfonyloxy group, an alkenyl group, an aryl group, an aralkyl group or a carboxy group; and a to f each independently represents an integer of 0 to 3.

(5) The negative resist composition as described in any of (1), (2) and (4) above, wherein the crosslinking agent (B) is a phenol derivative having a molecular weight of 1,200 or less, containing from 3 to 5 benzene rings within a molecule thereof, and having two or more hydroxymethyl groups or alkoxymethyl groups in total, the two or more hydroxymethyl groups or alkoxymethyl groups being bonded to at least any one benzene ring in a concentrated manner or distributed among the benzene rings.

(6) The negative resist composition as described in any of (1), (2), (4) and (5) above, wherein the organic carboxylic acid (E) is at least one selected from the group consisting of a saturated or unsaturated aliphatic carboxylic acid, an alicyclic carboxylic acid, an oxycarboxylic acid, an alkoxycarboxylic acid, a ketocarboxylic acid and an aromatic carboxylic acid.

(7) The negative resist composition as described in (6) above, wherein the organic carboxylic acid (E) is at least one selected from the group consisting of a benzoic acid, a 1-hydroxy-2-naphthoic acid and a 2-hydroxy-3-naphthoic acid.

DETAILED DESCRIPTION OF THE INVENTION

The negative resist composition of the present invention is described in detail below.

Incidentally, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) Alkali-Soluble Polymer

The alkali-soluble polymer for use in the present invention contains a repeating unit represented by formula (1) as an essential component.

In formula (1), the alkyl group as A is preferably an alkyl group having a carbon number of 1 to 3. Examples of the halogen atom as A include Cl, Br and F.

A is preferably a hydrogen atom or an alkyl group having a carbon number of 1 to 3 (e.g., methyl, ethyl), more preferably a hydrogen atom or a methyl group.

Examples of the halogen atom as $R_1$ and $R_2$ include Cl, Br, F and I.

The alkyl group, alkenyl group, cycloalkyl group, aryl group, aralkyl group, alkoxy group, alkylcarbonyloxy group or alkylsulfonyloxy group as $R_1$ and $R_2$ may have a substituent. Also, $R_1$ and $R_2$ may form a ring in cooperation.

$R_1$ and $R_2$ each is independently, preferably a linear or branched alkyl group having a carbon number of 1 to 8, which may have a substituent, an alkenyl group having a carbon number of 1 to 8, which may have a substituent, a cycloalkyl group having a carbon number of 5 to 10, which may have a substituent, an aryl group having a carbon number of 6 to 15, which may have a substituent, an aralkyl group having a carbon number of 7 to 16, which may have a substituent, an alkoxy group having a carbon number of 1 to 8, which may have a substituent, or an alkylcarbonyloxy group having a carbon number of 1 to 8, which may have a substituent.

Examples of the substituent include an alkyl group (e.g., methyl, ethyl, propyl, isopropyl, butyl, tert-butyl, hexyl), an aryl group (e.g., phenyl, naphthyl), an aralkyl group, a hydroxyl group, an alkoxy group (e.g., methoxy, ethoxy, butoxy, octyloxy, dodecyloxy), an acyl group (e.g., acetyl, propanoyl, benzoyl) and an oxo group.

$R_1$ and $R_2$ each is independently, more preferably a hydrogen atom, a halogen atom, an alkyl group having a carbon number of 1 to 4, which may have a substituent, an alkoxy group having a carbon number of 1 to 4, which may have a substituent, or an alkylcarbonyloxy group having a carbon number of 1 to 4, which may have a substituent, still more preferably a hydrogen atom, a chlorine atom, a bromine atom, an iodine atom, an alkyl group having a carbon number of 1 to 3 (e.g., methyl, ethyl, propyl, isopropyl), or an alkoxy group having a carbon number of 1 to 3 (e.g., methoxy, ethoxy, propyloxy, isopropyloxy).

The polymer as the component (A) for use in the present invention may have at least one repeating unit represented by formulae (3) to (5), together with the repeating unit represented by formula (1).

In formulae (3) to (5), A has the same meaning as A in formula (1), X represents a single bond, a —COO— group, a —O— group, or a —CON($R_{16}$)— group, $R_{16}$ represents a hydrogen atom or an alkyl group having a carbon number of 1 to 3 (e.g., methyl, ethyl, propyl). X is preferably a single bond, —COO—, or —CON($R_{16}$), more preferably a —COO— group.

$R_{11}$ to $R_{15}$ each independently has the same meaning as $R_1$ in formula (1).

$R_{101}$ to $R_{106}$ each independently represents a hydroxy group, a halogen atom (Cl, Br, F, I), a linear or branched alkyl group having a carbon number of 1 to 8, which may have a substituent, a linear or branched alkoxy group having a carbon number of 1 to 8, a linear or branched alkylcarbonyloxy group having a carbon number of 1 to 8, which may have a substituent, a linear or branched alkylsulfonyloxy group having a carbon number of 1 to 8, which may have a substituent, an alkenyl group having a carbon number of 1 to 8, which may have a substituent, an aryl group having a carbon number of 7 to 15, which may have a substituent, an aralkyl group having a carbon number of 7 to 16, which may have a substituent, or a carboxy group.

Examples of the substituent thereof are the same as those of the substituent of $R_1$ in formula (1).

$R_{101}$ to $R_{106}$ each is independently, preferably a hydrogen atom, a halogen atom, an alkyl group having a carbon number of 1 to 4, which may have a substituent, an alkoxy group having a carbon number of 1 to 4, which may have a substituent, or an alkylcarbonyloxy group having a carbon number of 1 to 4, which may have a substituent, more preferably a hydrogen atom, a chlorine atom, a bromine atom, an iodine atom, an alkyl group having a carbon number of 1 to 3 (e.g., methyl, ethyl, propyl, isopropyl), an alkoxy group having a carbon number of 1 to 3 (e.g., methoxy, ethoxy, propyloxy, isopropyloxy), or an alkylcarbonyloxy group having a carbon number of 1 to 3 (e.g., acetyl, propionyl).

a to f each independently represents an integer of 0 to 3.

The polymer as the component (A) for use in the present invention may be any of a resin having only one repeating unit represented by formula (1), a resin having two or more repeating units each represented by formula (1), and a resin having a repeating unit represented by formula (1) and at least one repeating unit selected from the repeating units represented by formulae (3) to (5), and other polymerizable monomers capable of controlling the film-forming property or alkali solubility may be also polymerized therein.

Example of such a polymerizable monomer include, but are not limited to, styrene, an alkyl-substituted styrene, an alkoxy-substituted styrene, an O-alkylated styrene, an O-acylated styrene, a hydrogenated hydroxystyrene, maleic anhydride, an acrylic acid derivative (e.g., acrylic acid, acrylic acid ester), a methacrylic acid derivative (e.g., methacrylic acid, methacrylic acid ester), an N-substituted maleimide, acrylonitrile and methacrylonitrile.

The content of the repeating unit represented by formula (1) in the polymer as the component (A) for use in the present invention is generally from 50 to 100 mol %, preferably from 70 to 100 mol %.

In the polymer as the component (A), the ratio between the repeating unit represented by formula (1) and the repeating unit(s) represented by formulae (3) to (5) is, in terms of the molar ratio, preferably from 100/0 to 50/50, more preferably from 100/0 to 60/40, still more preferably from 100/0 to 70/30.

The molecular weight of the polymer as the component (A) is, in terms of the weight average molecular weight, preferably from 1,000 to 200,000, more preferably from 2,000 to 50,000.

The molecular weight distribution (Mw/Mn) of the polymer as the component (A) is preferably from 1.0 to 2.0, more preferably from 1.0 to 1.35.

The amount added of the polymer as the component (A) is from 30 to 95 mass %, preferably from 40 to 90 mass %, more preferably from 50 to 80 mass %, based on the entire solid content of the composition. (In this specification, mass ratio is equal to weight ratio.)

Here, the molecular weight and molecular weight distribution of the polymer are defined as a polystyrene-reduced value by the GPC measurement.

The polymer as the component (A) can be synthesized by a known radical polymerization method or anionic polymerization method. For example, in the radical polymerization method, the vinyl monomer is dissolved in an appropriate organic solvent, and the reaction is allowed to proceed at room temperature or under heating by using a peroxide (e.g., benzoyl peroxide), a nitrile compound (e.g., azobisisobutyronitrile) or a redox compound (e.g., cumene hydroperoxide-ferrous salt) as the initiator, whereby the polymer can be obtained. In the anionic polymerization method, the vinyl monomer is dissolved in an appropriate organic solvent, and the reaction is allowed to proceed usually under cooling by using a metal compound (e.g., butyllithium) as the initiator, whereby the polymer can be obtained.

Specific examples of the alkali-soluble polymer as the component (A) for use in the present invention are set forth below, but the present invention is not limited thereto.

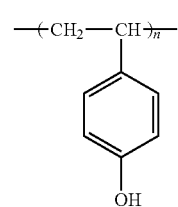

(1)

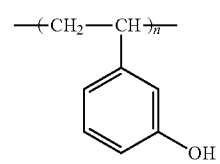

(2)

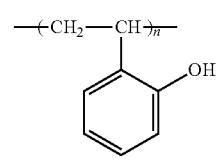

(3)

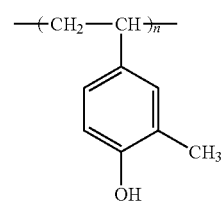

(4)

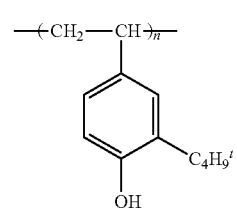

(5)

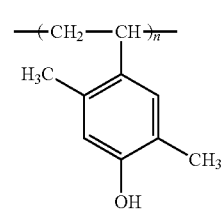

(6)

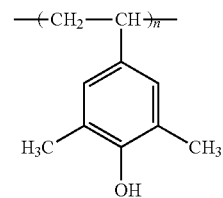

(7)

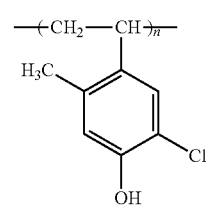

(8)

(9)
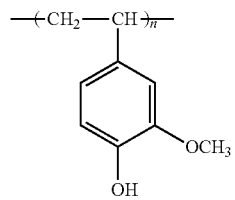
(10)
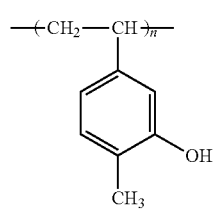
(11)
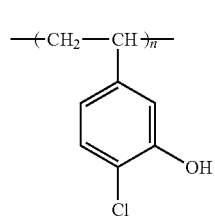
(12)
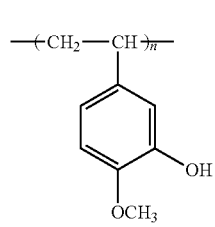
(13)
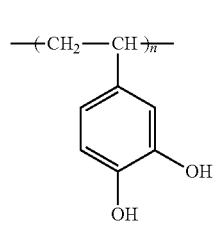
(14)
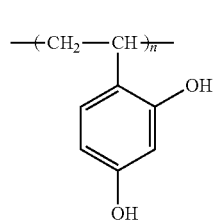
(15)
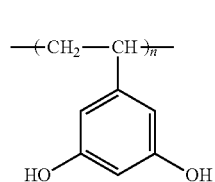
(16)
(17)
(18)
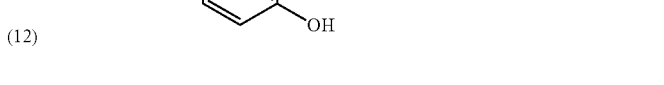
(19)

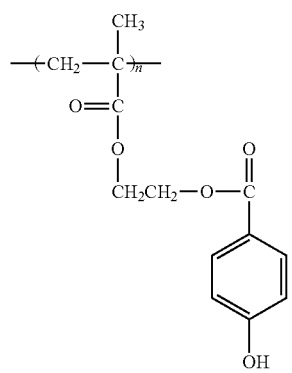
(20)
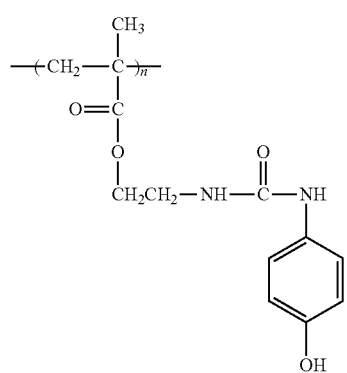
(21)
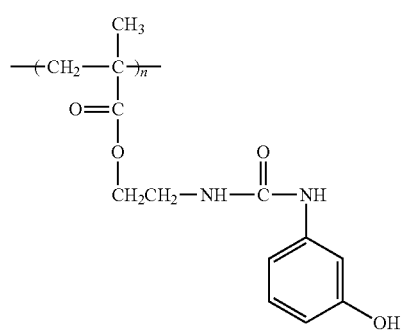
(22)
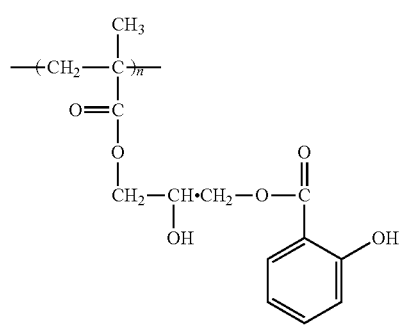
(23)
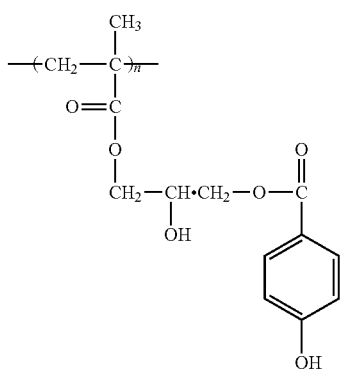
(24)
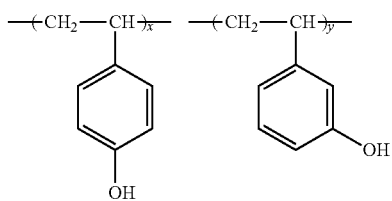
(25)
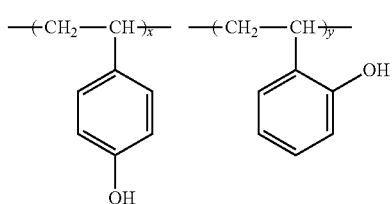
(26)
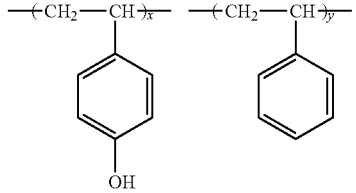
(27)
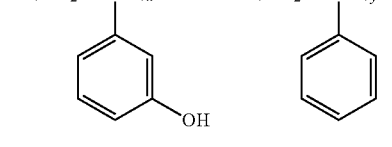
(28)
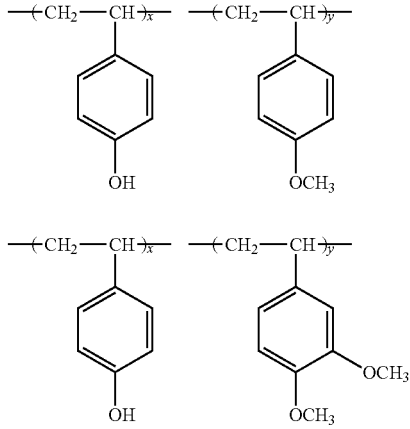
(29)
(30)

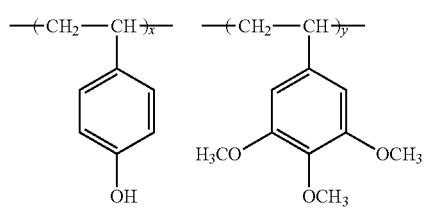 (31)
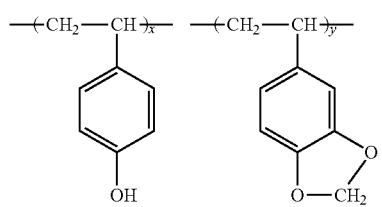 (32)
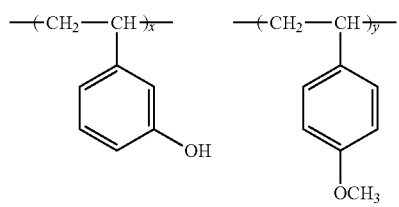 (33)
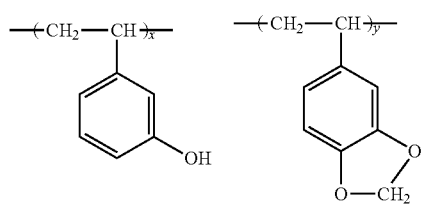 (34)
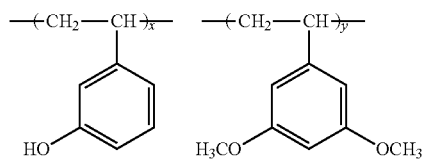 (35)
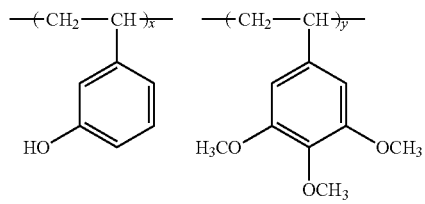 (36)
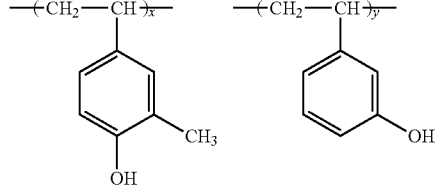 (37)
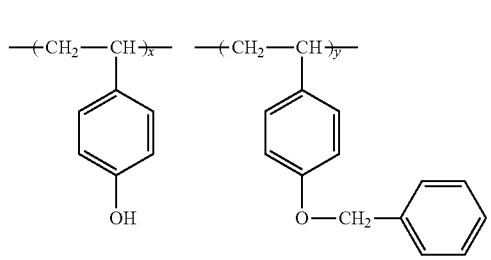 (38)
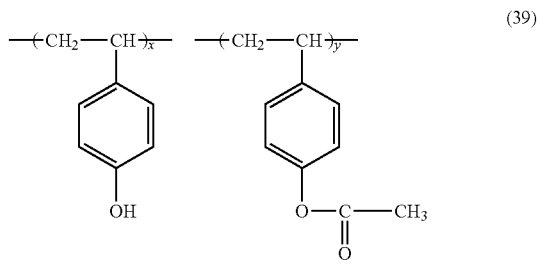 (39)
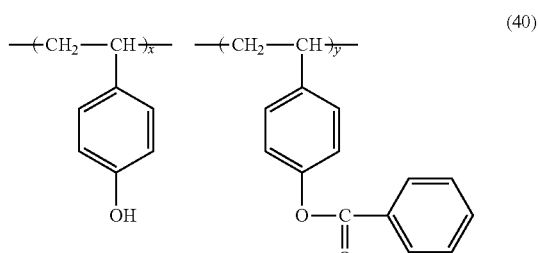 (40)
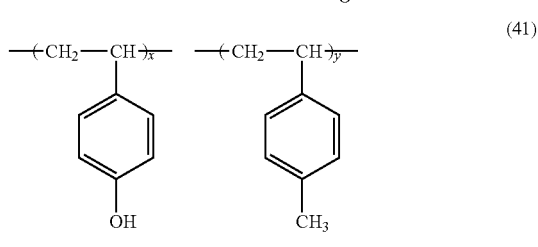 (41)
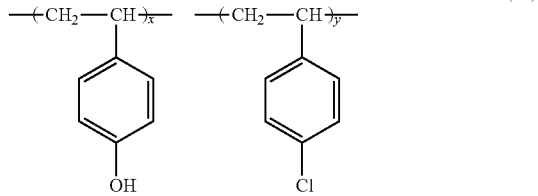 (42)
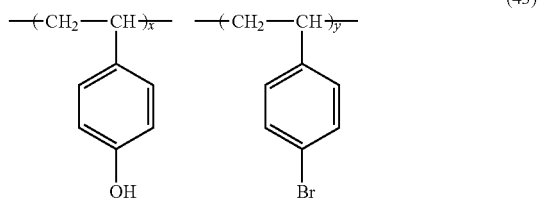 (43)
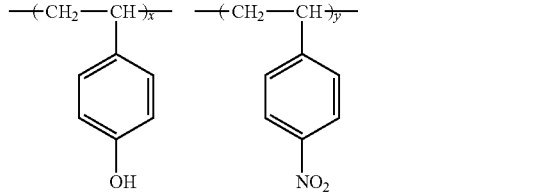 (44)

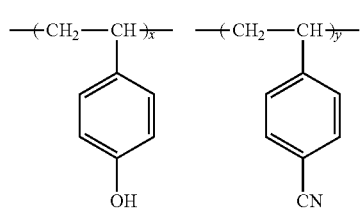 (45)
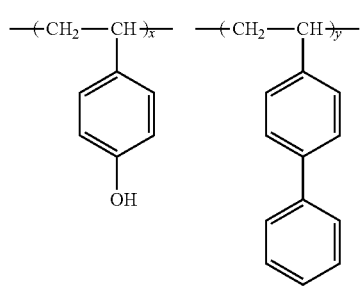 (46)
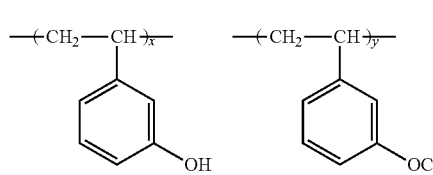 (47)
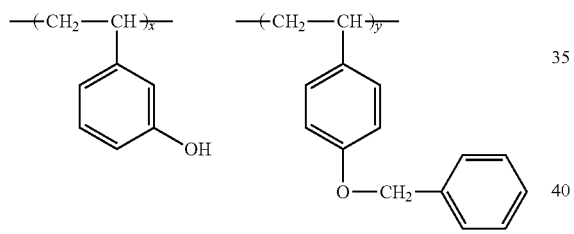 (48)
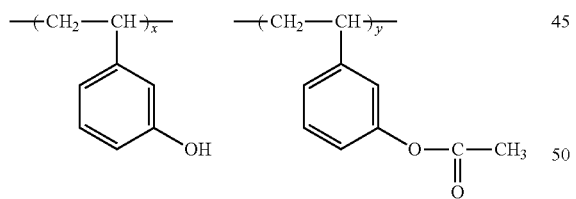 (49)
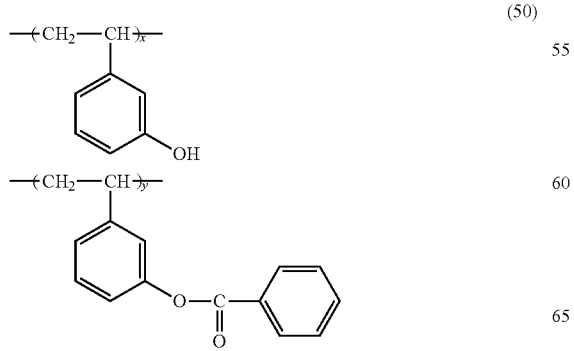 (50)
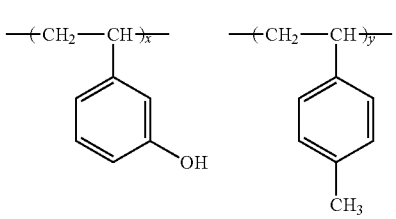 (51)
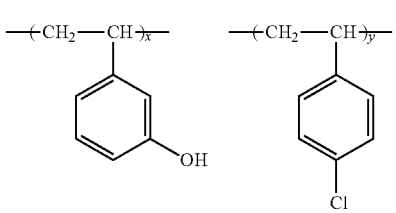 (52)
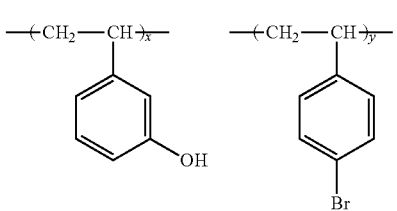 (53)
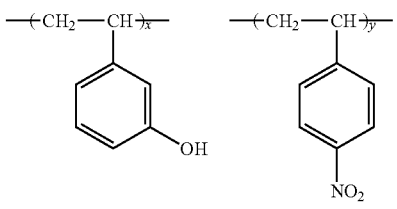 (54)
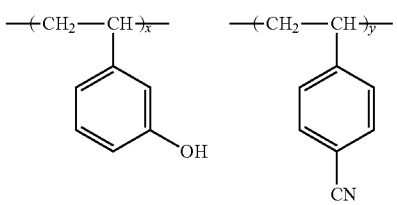 (55)
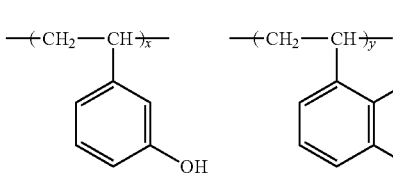 (56)
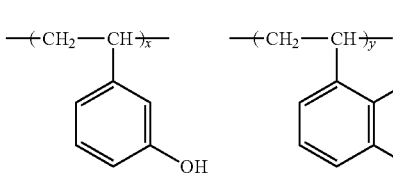 (57)

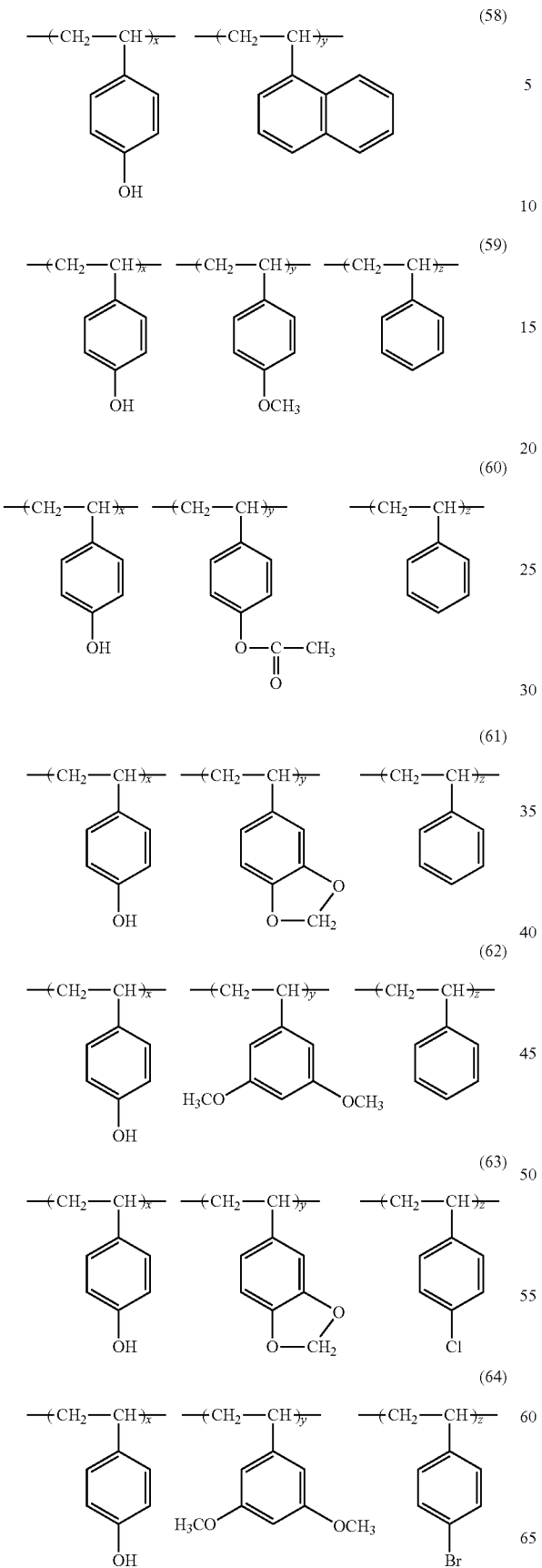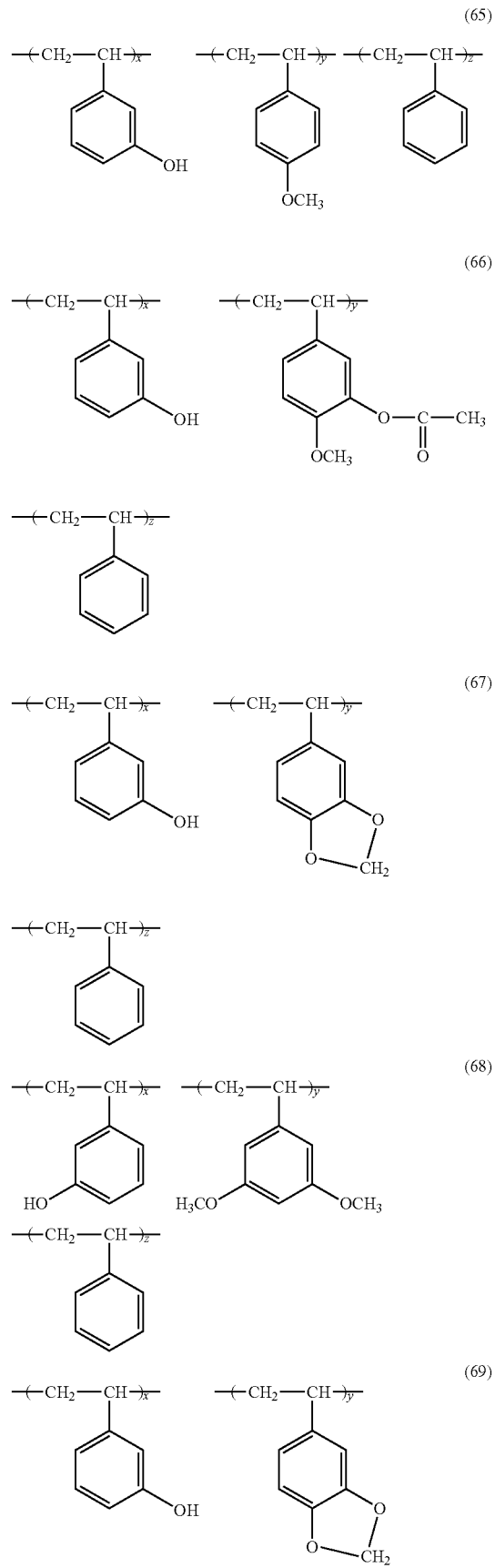

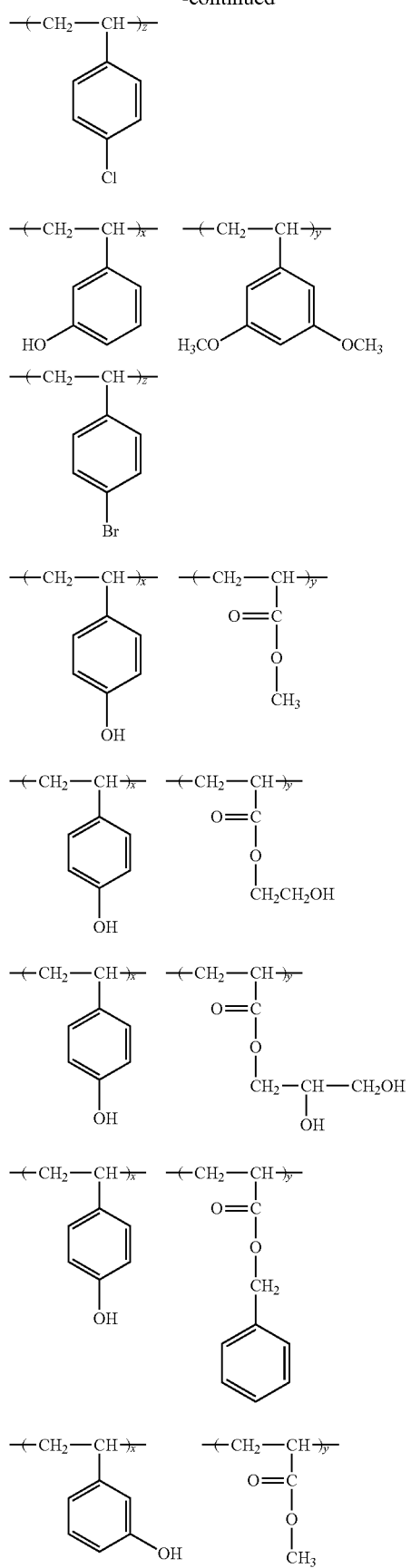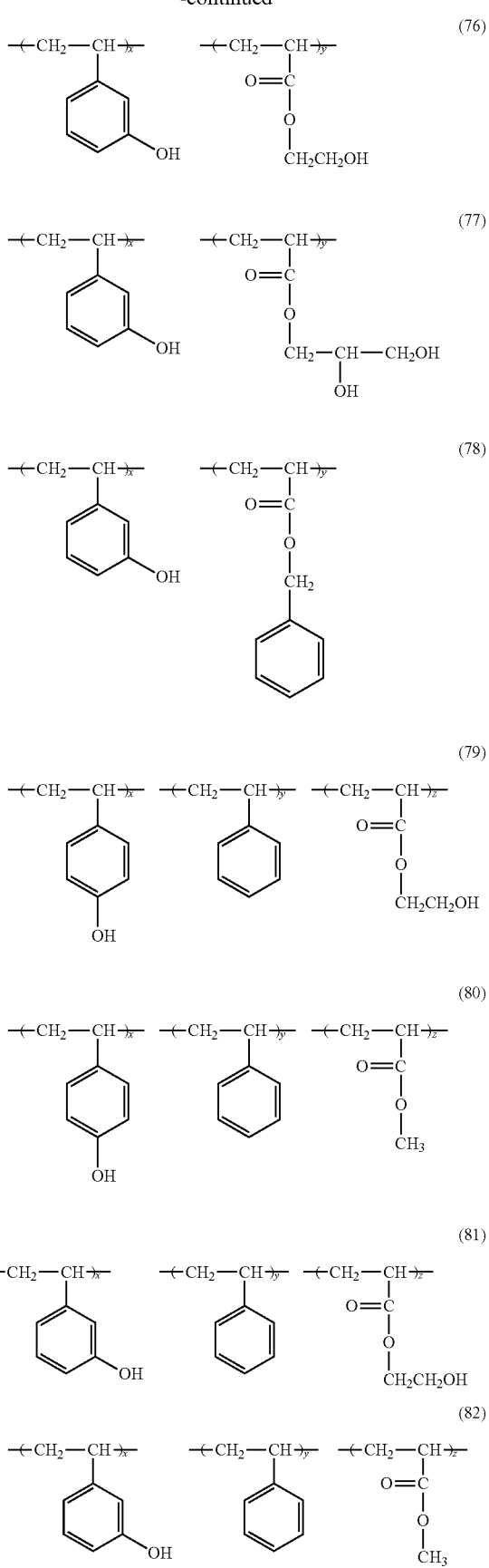

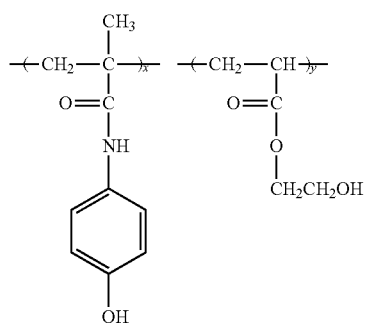
(83)
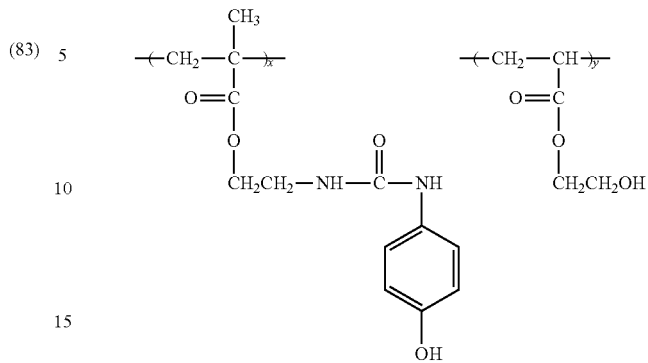
(87)
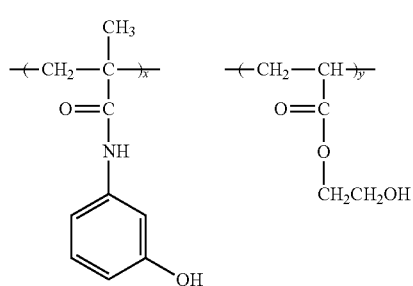
(84)
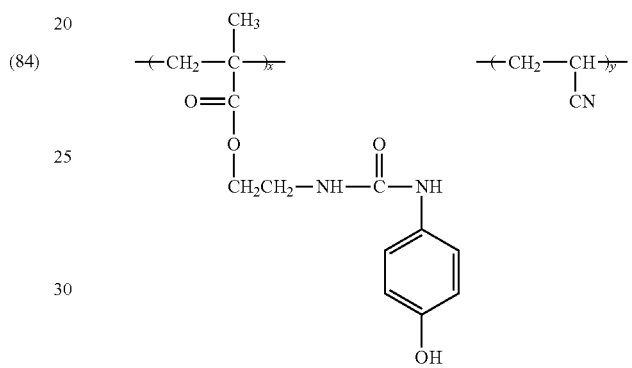
(88)
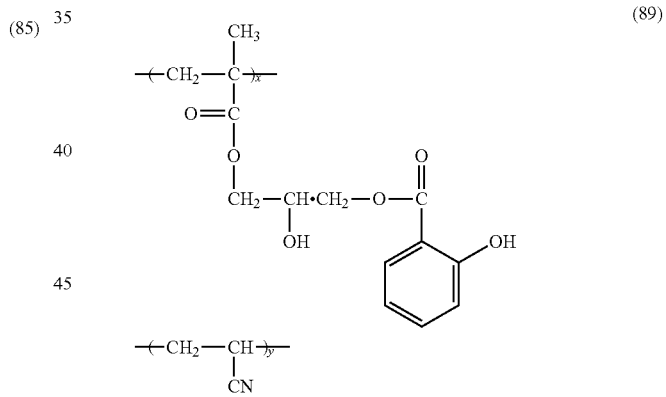
(85)
(89)
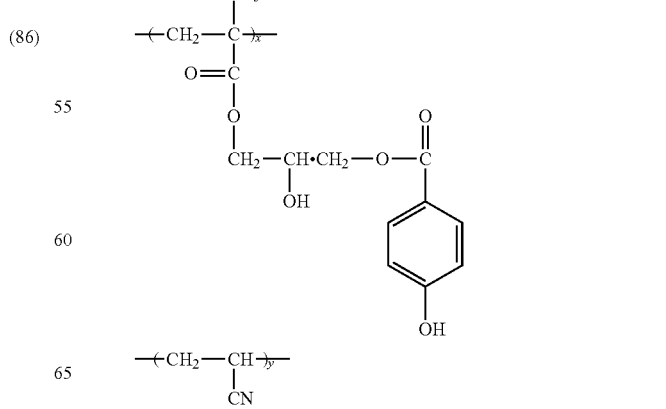
(86)
(90)

-continued

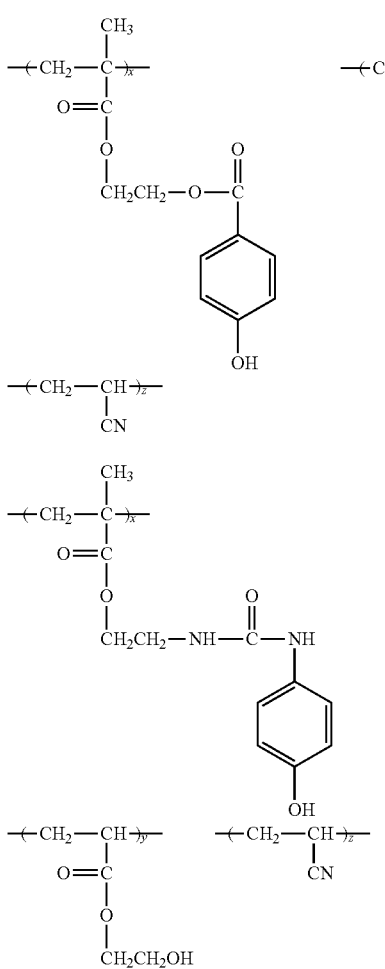

(91)

(92)

In specific examples above, n represents a positive integer, and x, y and z represent the molar ratio of the composition. In the case of a resin comprising two components, the molar ratio is x=10 to 95 and y=5 to 90, preferably x=40 to 90 and y=10 to 60, and in the case of a resin comprising three components, the molar ratio is x=10 to 90, y=5 to 85 and z=5 to 85, preferably x=40 to 80, y=10 to 50 and z=10 to 50.

One of these polymers may be used alone, or two or more thereof may be mixed and used.

[2] Acid Cross-Linking Agent (Component (B))

In the present invention, a compound capable of crosslinking under the action of an acid (hereinafter sometimes referred to as an "acid crosslinking agent" or simply as a "crosslinking agent") is used together with the alkali-soluble polymer. A known acid crosslinking agent can be effectively used here.

The acid crosslinking agent is preferably a compound or resin having two or more hydroxymethyl groups, alkoxymethyl groups, acyloxymethyl groups or alkoxymethyl ether groups, or an epoxy compound.

More preferred examples thereof include an alkoxymethylated or acyloxymethylated melamine compound or resin, an alkoxymethylated or acyloxymethylated urea compound or resin, a hydroxymethylated or alkoxymethylated phenol compound or resin, and an alkoxymethyl-etherified phenol compound or resin.

The component (B) is still more preferably a phenol derivative having a molecular weight of 1,200 or less, containing from 3 to 5 benzene rings within the molecule, and having two or more hydroxymethyl groups or alkoxymethyl groups in total, where the hydroxymethyl groups or alkoxymethyl groups are bonded in a concentrated manner to at least any one benzene ring or distributed among the benzene rings. By virtue of using such a phenol derivative, the effects of the present invention are more remarkably brought out.

The alkoxymethyl group bonded to the benzene ring is preferably an alkoxymethyl group having a carbon number of or less, specifically, a methoxymethyl group, an ethoxymethyl group, an n-propoxymethyl group, an i-propoxymethyl group, an n-butoxymethyl group, an i-butoxymethyl group, a sec-butoxymethyl group, or a tert-butoxymethyl group. An alkoxy-substituted alkoxy group such as 2-methoxyethoxy group and 2-methoxy-1-propyl group is also preferred.

The crosslinking agent (B) is preferably a phenol compound having two or more benzene rings within the molecule and containing no nitrogen atom.

Out of these phenol derivatives, particularly preferred compounds are set forth below.

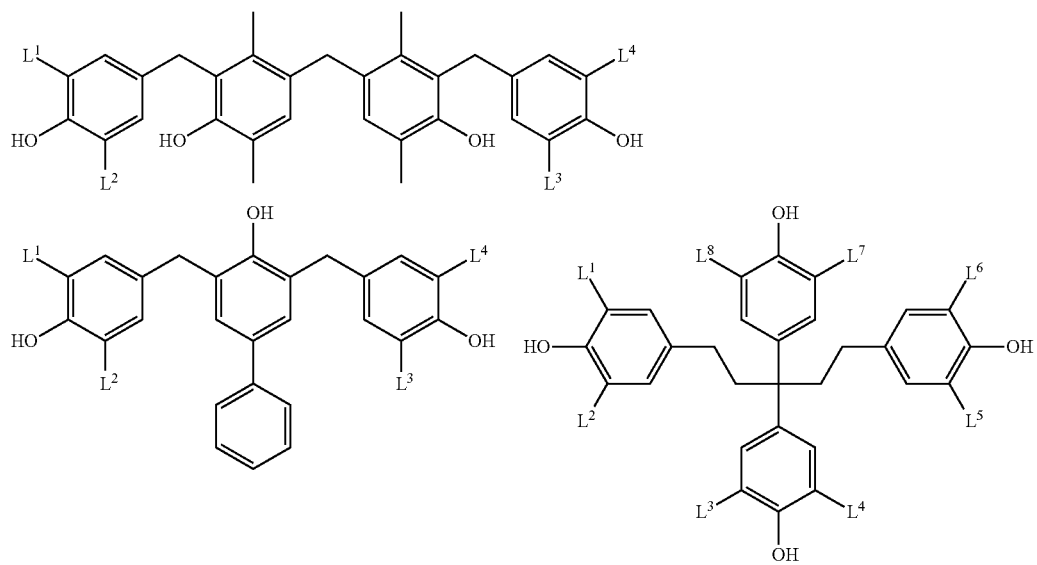

-continued
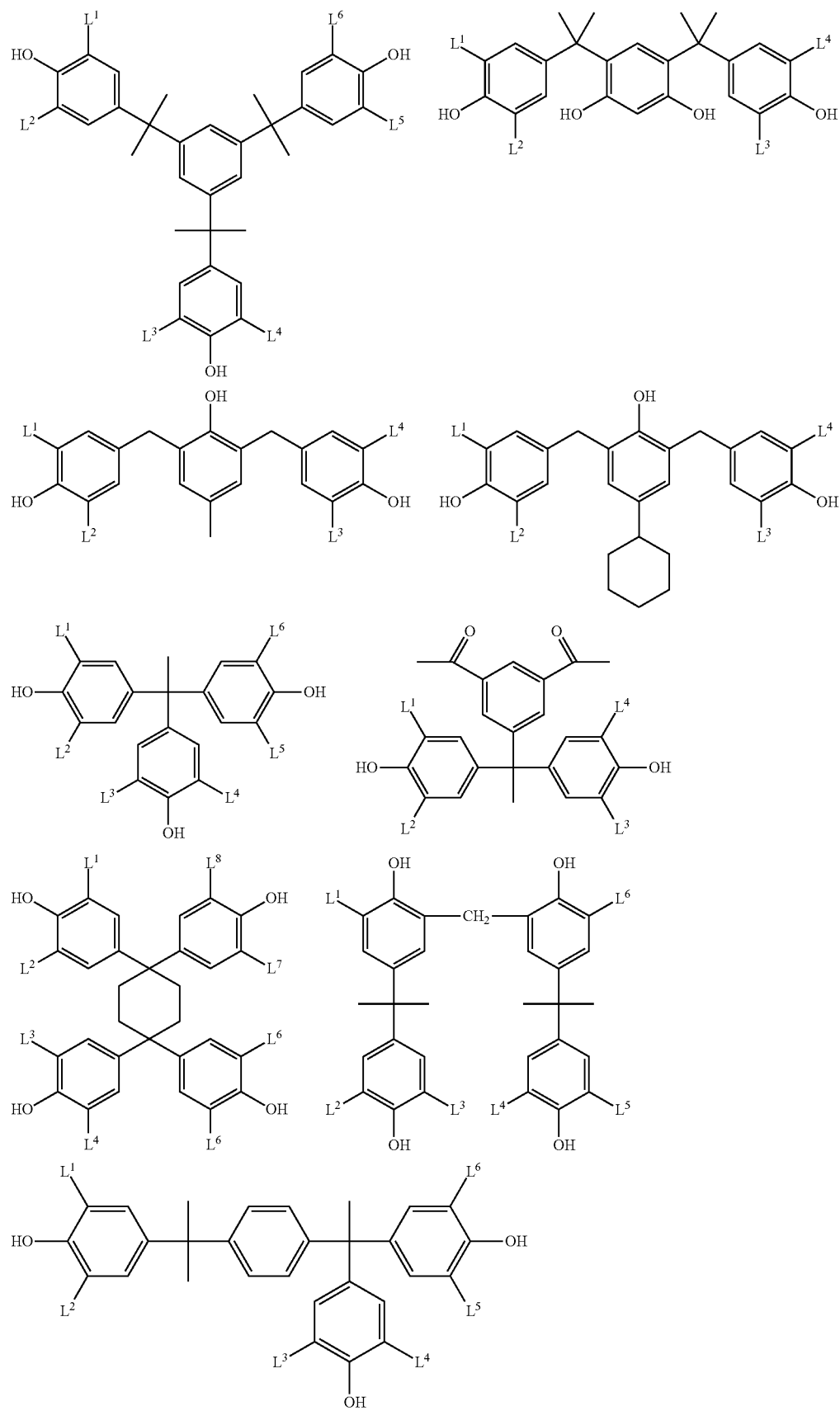

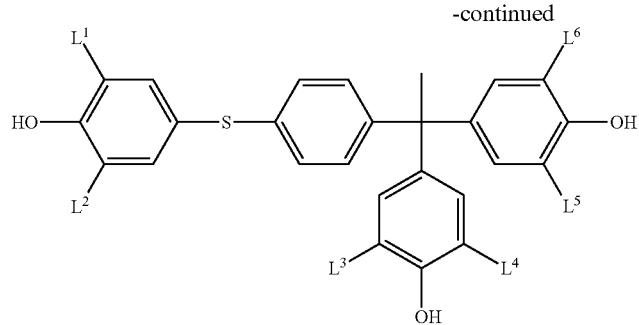
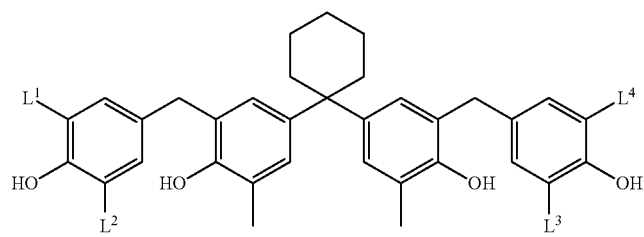
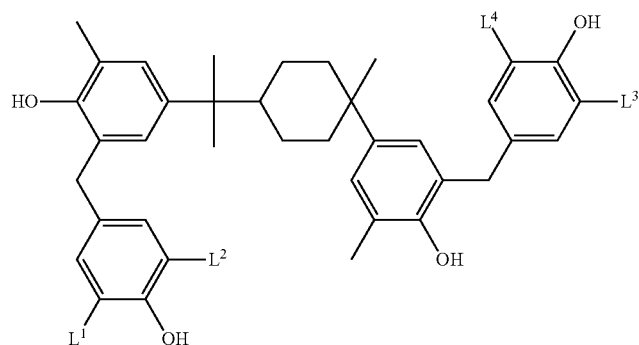
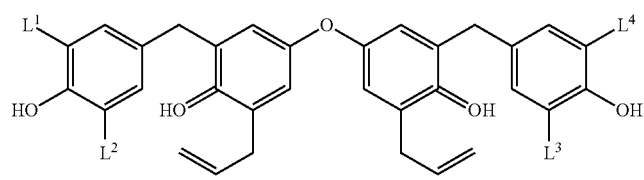
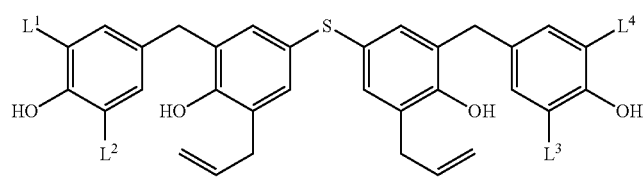
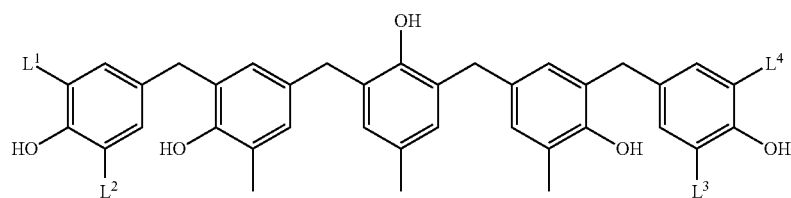

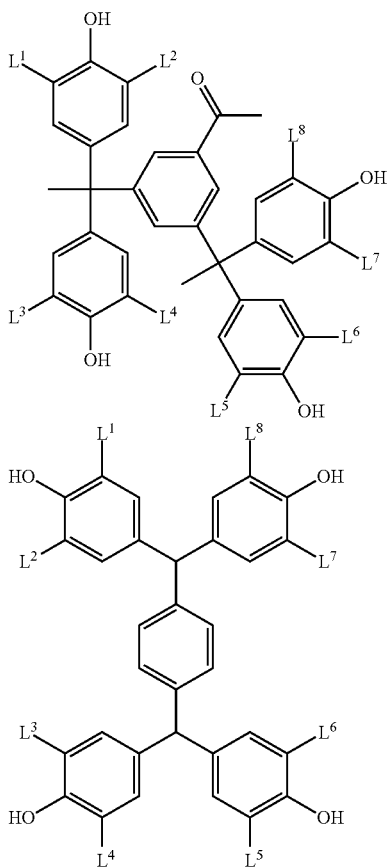

(wherein $L^1$ to $L^8$ may be the same or different and each represents a hydroxymethyl group, a methoxymethyl group or an ethoxymethyl group).

The phenol derivative having a hydroxymethyl group can be obtained by reacting a corresponding phenol compound having no hydroxymethyl group (a compound where in the formulae above, $L^1$ to $L^8$ each is a hydrogen atom) with formaldehyde in the presence of a base catalyst. At this time, in order to prevent resinification or gelling, the reaction is preferably performed at a temperature of 60° C. or less. Specifically, this phenol derivative can be synthesized by the method described, for example, in JP-A-6-282067 and JP-A-7-64285.

The phenol derivative having an alkoxymethyl group can be obtained by reacting a corresponding phenol derivative having a hydroxymethyl group with an alcohol in the presence of an acid catalyst. At this time, in order to prevent resinification or gelling, the reaction is preferably performed at a temperature of 100° C. or less. Specifically, this phenol derivative can be synthesized by the method described, for example, in EP-A-632003.

The thus-synthesized phenol derivative having a hydroxymethyl group or an alkoxymethyl group is preferred in view of stability during storage, but a phenol derivative having an alkoxymethyl group is particularly preferred in view of stability during storage.

One of these phenol derivatives having two or more hydroxymethyl groups or alkoxymethyl groups in total bonded in a concentrated manner to at least any one benzene ring or distributed among the benzene rings may be used alone, or two or more thereof may be used in combination.

Preferred examples of the crosslinking agent further include (i) a compound having an N-hydroxymethyl group, an N-alkoxymethyl group or an N-acyloxymethyl group, and (ii) an epoxy group, which are described below.

Examples of the (i) compound having an N-hydroxymethyl group, an N-alkoxymethyl group or an N-acyloxymethyl group include monomers, oligomer-melamine-formaldehyde condensates and urea-formaldehyde condensates disclosed in EP-A-0133216 and West German Patent Nos. 3,634,671 and 3,711,264, and alkoxy-substituted compounds and benzoguanamine-formaldehyde condensates disclosed in EP-A-0212482.

More preferred examples include a melamine-formaldehyde derivative having at least two free N-hydroxymethyl groups, N-alkoxymethyl groups or N-acyloxymethyl groups, with an N-alkoxymethyl derivative being still more preferred.

The (ii) epoxy compound includes a monomer-, dimer-, oligomer- or polymer-form epoxy compound containing one or more epoxy groups. Examples thereof include a reaction product of bisphenol A and epichlorohydrin, and a reaction product of low molecular weight phenol-formaldehyde resin and epichlorohydrin. Other examples include epoxy resins described and used in U.S. Pat. No. 4,026,705 and British Patent 1,539,192.

The crosslinking agent is preferably added in an amount of 3 to 65 mass %, more preferably from 5 to 50 mass %. When the amount of the crosslinking agent added is from 3 to 65 mass %, reduction in the residual film ratio and resolving power can be prevented and at the same time, good stability of the resist solution can be maintained during storage.

In the present invention, one crosslinking agent may be used alone, or two or more kinds of crosslinking agents may be used in combination.

For example, in the case of using other crosslinking agents such as (i) and (ii) above in addition to the phenol derivative, the ratio between the phenol derivative and the other crosslinking agent is, in terms of the molar ratio, from 100/0 to 20/80, preferably from 90/10 to 40/60, more preferably from 80/20 to 50/50.

[3] Compound Capable of Generating an Acid Upon Irradiation with Actinic Rays or Radiation (Component (C))

The negative resist composition of the present invention comprises a compound capable of generating an acid upon irradiation with actinic rays or radiation (hereinafter sometimes referred to as an "acid generator").

The acid generator which can be used may be appropriately selected from a photoinitiator for photo-cationic polymerization, a photoinitiator for photoradical polymerization, a photo-decoloring agent for coloring matters, a photo-discoloring agent, a compound known to generate an acid upon irradiation with actinic rays or radiation and used for microresist or the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Also, a compound where a group or compound capable of generating an acid upon irradiation with actinic rays or radiation is introduced into the main or side chain of a polymer, such as compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of decomposing upon irradiation with actinic rays or radiation to generate an acid, the compounds represented by the following formulae (ZI), (ZII) and (ZIII) are preferred.

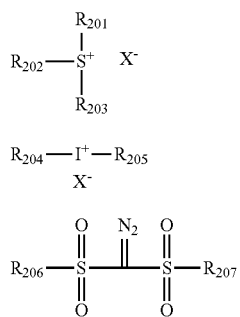

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes organic anions represented by the following formulae (AN1) to (AN4):

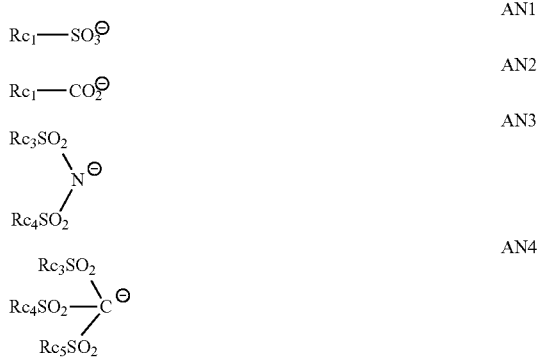

In formulae (AN1) and (AN2), $Rc_1$ represents an organic group.

The organic group in $Rc_1$ includes an organic group having a carbon number of 1 to 30 and is preferably an alkyl or aryl group which may be substituted, or a group where a plurality of such groups are connected through a single bond or a linking group such as —O—, —$CO_2$—, —S—, —$SO_3$— and —$SO_2N(Rd_1)$—.

$Rd_1$ represents a hydrogen atom or an alkyl group and may form a ring structure together with the alkyl or aryl group to which $Rd_1$ is bonded.

The organic group of $Rc_1$ is more preferably an alkyl group substituted by a fluorine atom or a fluoroalkyl group at the 1-position, or a phenyl group substituted by a fluorine atom or a fluoroalkyl group. By virtue of having a fluorine atom or a fluoroalkyl group, the acidity of the acid generated upon irradiation with light increases and the sensitivity is enhanced. When $Rc_1$ has 5 or more carbon atoms, at least one carbon atom is preferably such that a part of hydrogen atoms remain without replacing all hydrogen atoms by a fluorine atom, and more preferably such that the number of hydrogen atoms is larger than the number of fluorine atoms. The absence of a perfluoroalkyl group having a carbon number of 5 or more enables reduction in the toxicity to ecology.

The most preferred embodiment of $Rc_1$ is a group represented by the following formula.

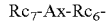

In the formula, $Rc_6$ represents a perfluoroalkylene group having a carbon number of 4 or less, preferably from to 4, more preferably 2 or 3, or a phenylene group substituted by from 1 to 4 fluorine atoms and/or from 1 to 3 fluoroalkyl groups.

Ax represents a single bond or a divalent linking group (preferably —O—, —$CO_2$—, —S—, —$SO_3$— or —$SO_2N(Rd_1)$-). $Rd_1$ represents a hydrogen atom or an alkyl group and may combine with $Rc_7$ to form a ring structure.

$Rc_7$ represents a hydrogen atom, a fluorine atom, a linear or branched alkyl group which may be substituted, a monocyclic or polycyclic cycloalkyl group which may be substituted, or an aryl group which may be substituted. The alkyl group, cycloalkyl group and aryl group, which each may be substituted, preferably contain no fluorine atom as the substituent.

In formulae (AN3) and (AN4), $Rc_3$, $Rc_4$ and $Rc_5$ each independently represents an organic group.

The preferred organic groups for $Rc_3$, $Rc_4$ and $Rc_5$ in formulae (AN3) and (AN4) are the same as the preferred organic groups in $Rc_1$.

$Rc_3$ and $Rc_4$ may combine to form a ring.

The group formed by combining $Rc_3$ and $Rc_4$ includes an alkylene group and an arylene group and is preferably a perfluoroalkylene group having a carbon number of 2 to 4. When $Rc_3$ and $Rc_4$ combine to form a ring, the acidity of the acid generated upon irradiation with light increases and this is preferred because the sensitivity is enhanced.

The carbon number of the organic group as $R_{201}$, $R_{202}$ and $R_{203}$ in formula (ZI) is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (Z1) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkyl-sulfonium compound, and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be either linear or branched and is preferably a linear or branched alkyl group preferably having a carbon number of 1 to 10 (e.g., methyl, ethyl, propyl, butyl, pentyl). The alkyl group as $R_{201}$ to $R_{203}$ is more preferably a linear or branched 2-oxoalkyl group or an alkoxycarbonylmethyl group.

The cycloalkyl group as $R_{201}$ to $R_{203}$ is preferably a cycloalkyl group having a carbon number of 3 to 10 (e.g., cyclopentyl, cyclohexyl, norbornyl).

The cycloalkyl group as $R_{201}$ to $R_{203}$ is more preferably a cyclic 2-oxoalkyl group.

The 2-oxoalkyl group as $R_{201}$ to $R_{203}$ may be linear, branched or cyclic and is preferably a group having >C=O at the 2-position of the above-described alkyl or cycloalkyl group.

The alkoxy group in the alkoxycarbonylmethyl group as $R_{201}$ to $R_{203}$ is preferably an alkoxy group preferably having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

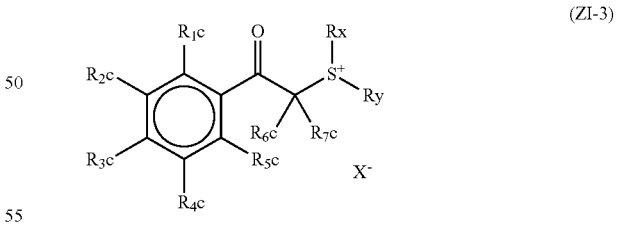

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{7c}$ or a pair of $R_x$ and $R_y$ may combine with each other to form a ring structure, and the ring structure may contain an oxygen atom, a sulfur atom, an ester bond or an amide bond. Examples of the group formed by combining any two or more members out of $R_{1c}$ to $R_{7c}$ or a pair of $R_x$ and $R_y$ include a butylene group and a pentylene group.

$X^-$ represents a non-nucleophilic anion, and examples thereof are the same as those of the non-nucleophilic anion of $X^-$ in formula (ZI).

The alkyl group as $R_{1c}$ to $R_{7c}$ may be linear or branched and is, for example, an alkyl group having a carbon number of 1 to 20, preferably a linear or branched alkyl group having a carbon number of 1 to 12 (for example, a methyl group, an ethyl group, a linear or branched propyl group, a linear or branched butyl group, or a linear or branched pentyl group).

The cycloalkyl group as $R_{1c}$ to $R_{7c}$ is preferably a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (for example, a methoxy group, an ethoxy group, a linear or branched propoxy group, a linear or branched butoxy group, or a linear or branched pentoxy group), or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group, or a linear, branched or cyclic alkoxy group is preferred, and a compound where the sum of carbon numbers of $R_{1c}$ to $R_{5c}$ is from 2 to 15 is more preferred. By virtue of this construction, the solvent solubility is more enhanced and generation of particles during storage is suppressed.

The alkyl group as $R_x$ and $R_y$ is the same as the alkyl group of $R_{1c}$ to $R_{7c}$. The alkyl group as $R_x$ and $R_y$ is preferably a linear or branched 2-oxoalkyl group or an alkoxycarbonylmethyl group.

The linear, branched or cyclic 2-oxoalkyl group includes a group having >C=O at the 2-position of the alkyl group or cycloalkyl group as $R_{1c}$ to $R_{7c}$.

The alkoxy group in the alkoxycarbonylmethyl group is the same as the alkoxy group of $R_{1c}$ to $R_{5c}$.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group which may have a substituent, an alkyl group which may have a substituent, or a cycloalkyl group which may have a substituent.

The aryl group of $R_{204}$ to $R_{207}$ is preferably a phenyl group or a naphthyl group, more preferably a phenyl group.

The alkyl group of $R_{204}$ to $R_{207}$ may be linear or branched and is preferably a linear or branched alkyl group having a carbon number of 1 to 10 (e.g., methyl, ethyl, propyl, butyl, pentyl).

The cycloalkyl group of $R_{204}$ to $R_{207}$ is preferably a cycloalkyl group having a carbon number of 3 to 10 (e.g., cyclopentyl, cyclohexyl, norbornyl).

Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion and is the same as the non-nucleophilic anion of $X^-$ in formula (ZI).

Out of the compounds capable of generating an acid upon irradiation with actinic rays or radiation, preferred compounds further include the compounds represented by the following formulae (ZIV), (ZV) and (ZVI):

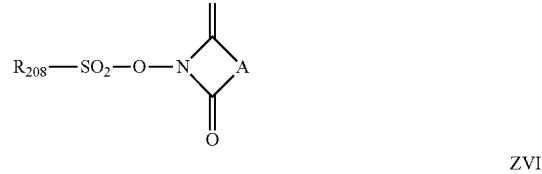

In formulae (ZIV) to (ZVI), $Ar_3$ and $Ar_4$ each independently represents a substituted or unsubstituted aryl group.

$R_{208}$ represents a substituted or unsubstituted alkyl group, a substituted or unsubstituted cycloalkyl group, or a substituted or unsubstituted aryl group.

$R_{209}$ and $R_{210}$ each represents a substituted or unsubstituted alkyl group, a substituted or unsubstituted cycloalkyl group, a substituted or unsubstituted aryl group, or an electron-withdrawing group. $R_{209}$ is preferably a substituted or unsubstituted aryl group, and $R_{210}$ is preferably an electron-withdrawing group, more preferably a cyano group or a fluoroalkyl group.

A represents a substituted or unsubstituted alkylene group, a substituted or unsubstituted alkenylene group, or a substituted or unsubstituted arylene group.

Among the compounds capable of generating an acid upon irradiation with actinic rays or radiation, the compounds represented by formulae (ZI) to (ZIII) are preferred, the compounds represented by formulae (ZI) and (ZII) are more preferred, and the compounds represented by formulae (ZI-1) to (ZI-3) are still more preferred.

Furthermore, a compound capable of generating an acid represented by any one of the following formulae (AC1) to (AC3) upon irradiation with actinic rays or radiation is preferred.

That is, a preferred acid generator is a compound where in the structure of formula (ZI), $X^-$ is an anion selected from formulae (AN1), (AN3) and (AN4), and a more preferred compound is a compound where $X^-$ is an anion selected from formulae (AN3) and (AN4).

Out of the compounds capable of decomposing upon irradiation with actinic rays or radiation to generate an acid, particularly preferred examples are set forth below.
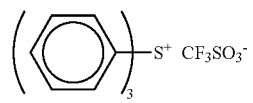
(z1)
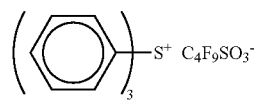
(z2)
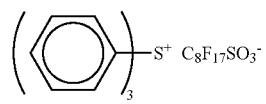
(z3)
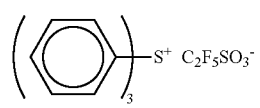
(z4)
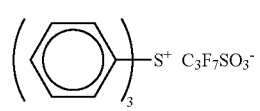
(z5)
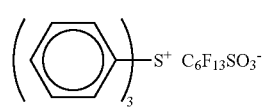
(z6)
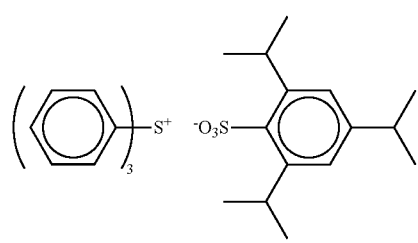
(z7)
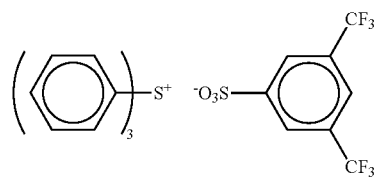
(z8)
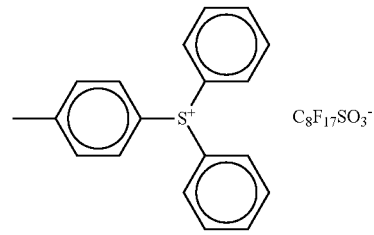
(z9)
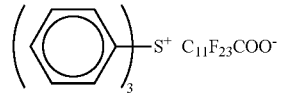
(z10)
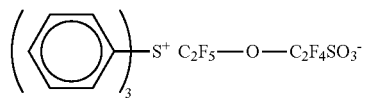
(z11)
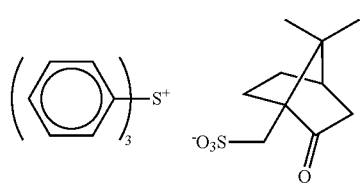
(z12)
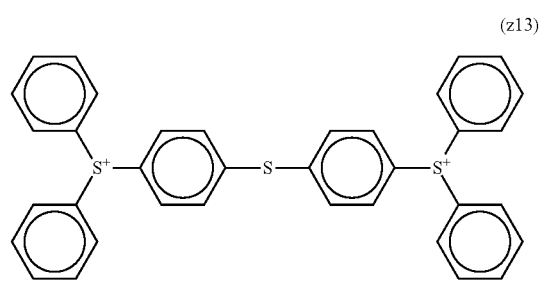
(z13)
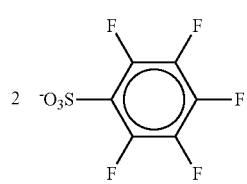
(z14)
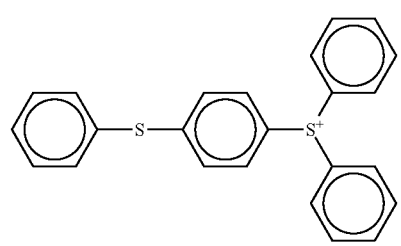
(z15)
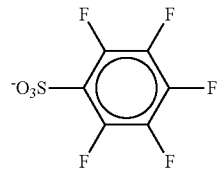
(z16)

(z17) 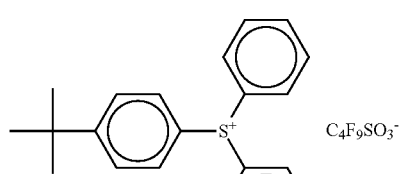
(z18) 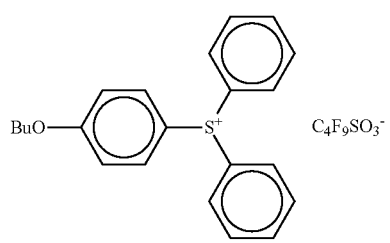
(z19) 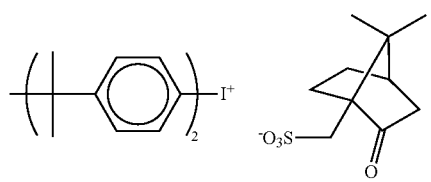
(z20) 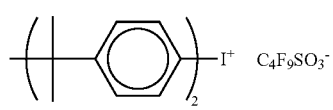
(z21) 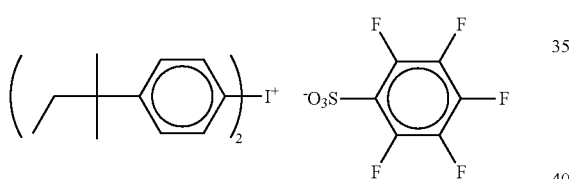
(z22) 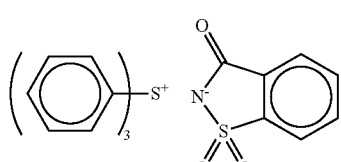
(z23) 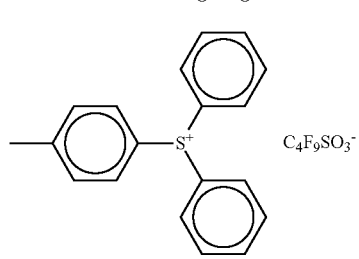
(z24) 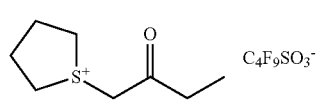
(z25) 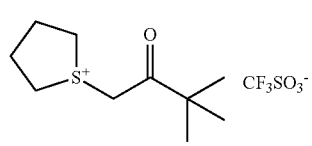
(z26) 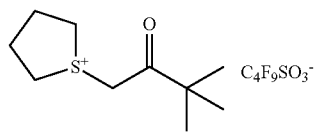
(z27) 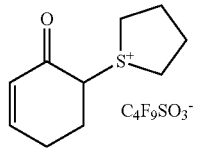
(z28) 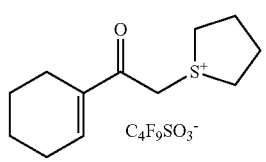
(z29) 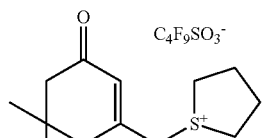
(z30) 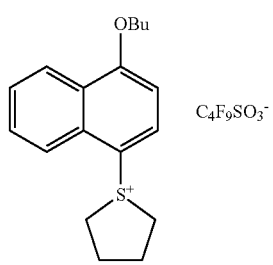
(z31) 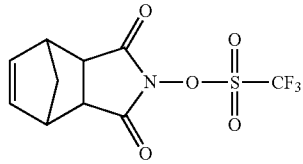
(z32) 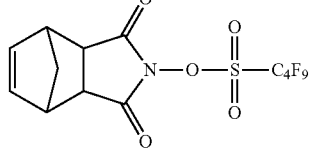
(z33) 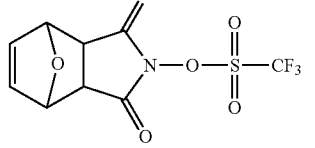
(z34) 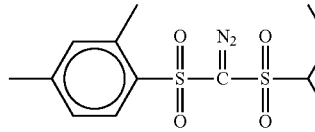

-continued
(z35) 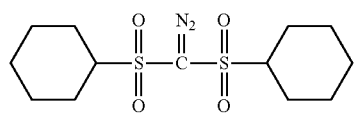
(z36) 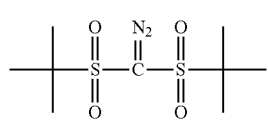
(z37) 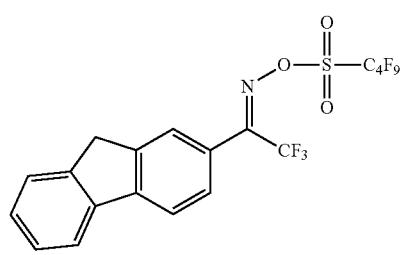
(z38) 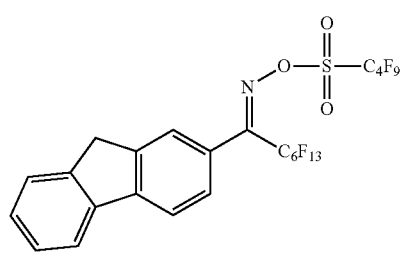
(z39) 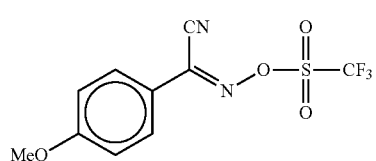
(z40) 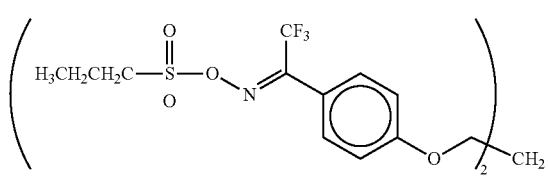
(z41) 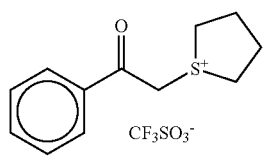
(z42) 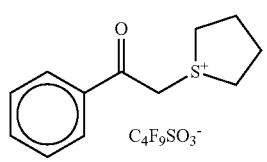
-continued
(z43) 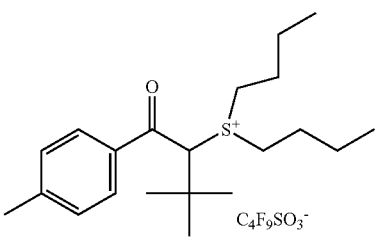
(z44) 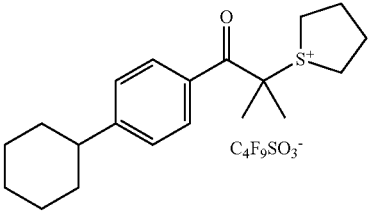
(z45) 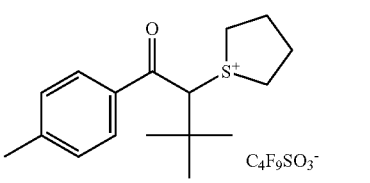
(z46) 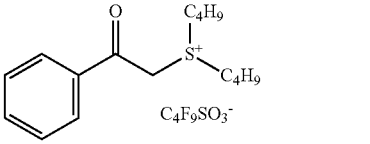
(z47) 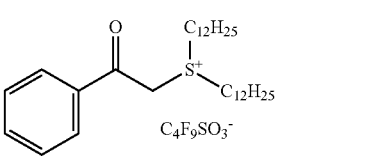
(z48) 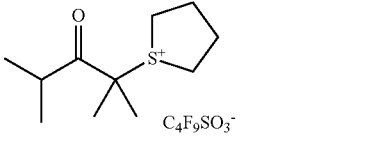
(z49) 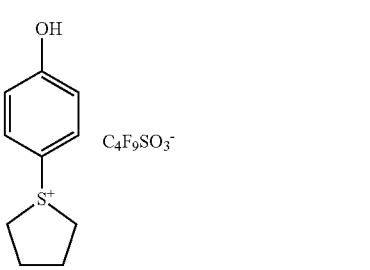
(z50) 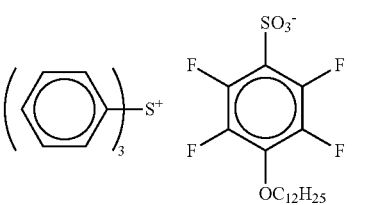

-continued
(z51) 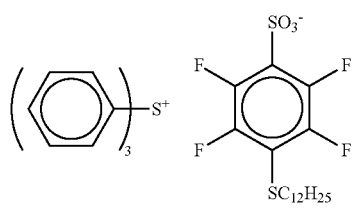
(z52) 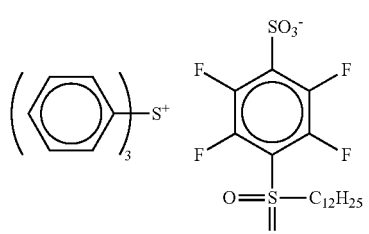
(z53) 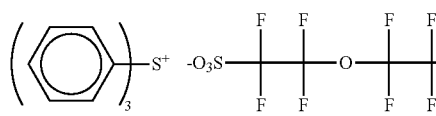
(z54) 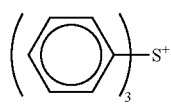
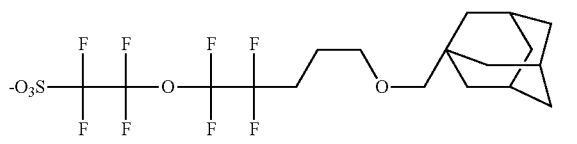
(z55) 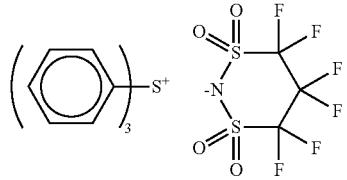
(z56) 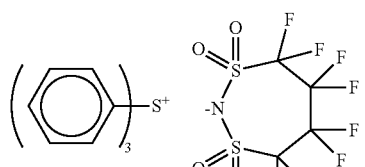
(z57) 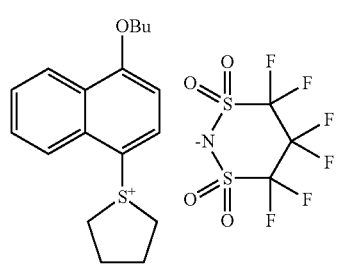
-continued
(z58) 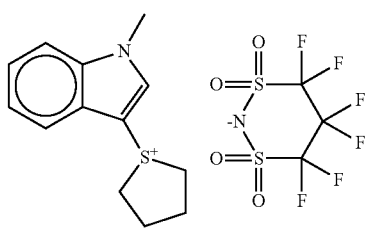
(z59) 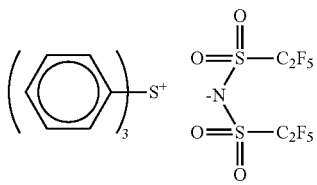
(z60) 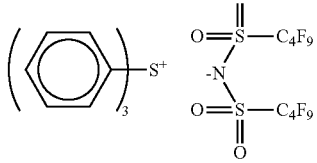
(z61) 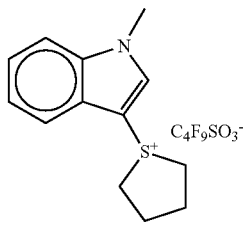
(z62) 
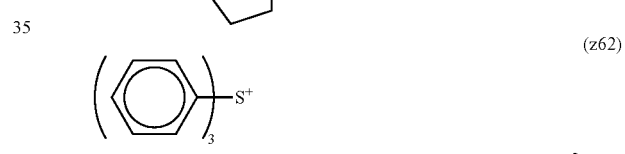
(z63) 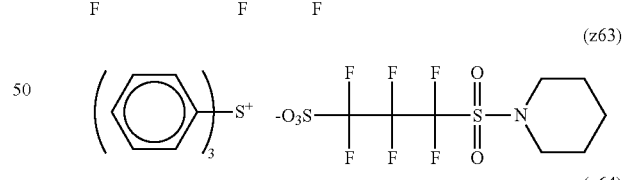
(z64) 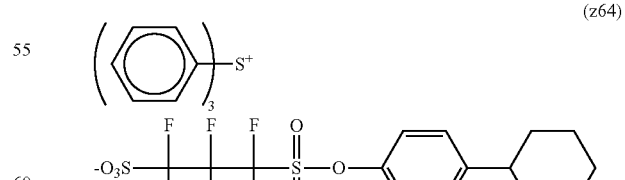
(z65) 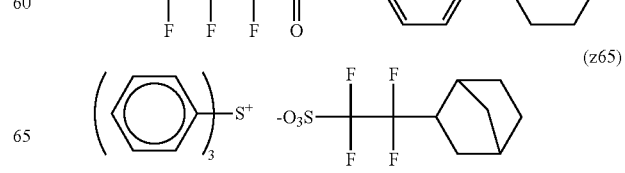

(z66) 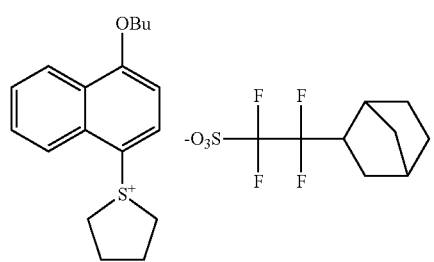
(z67) 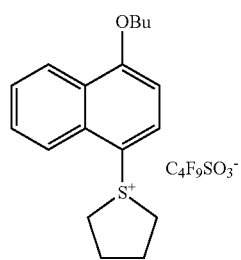
(z68) 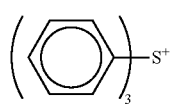
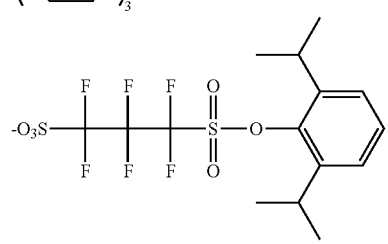
(z69) 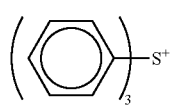
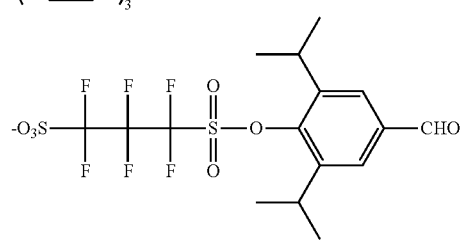
(z70) 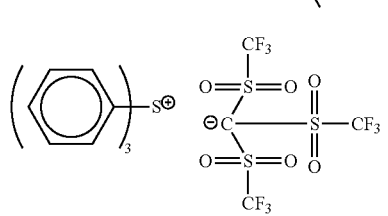
(z71) 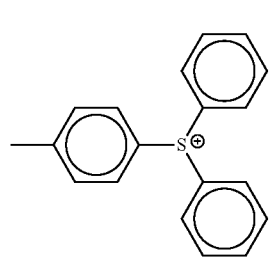
(z72) 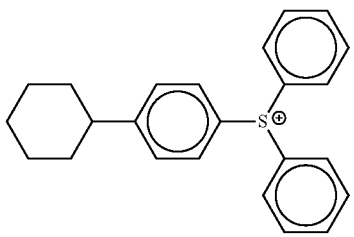
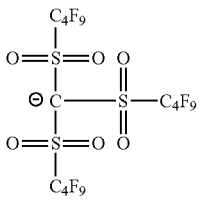
(z73) 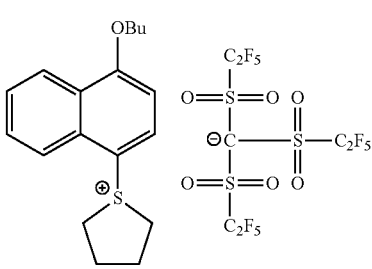
(z74) 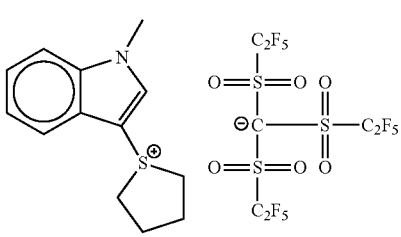
(z75) 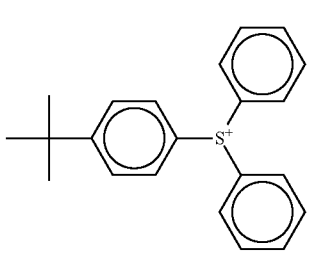
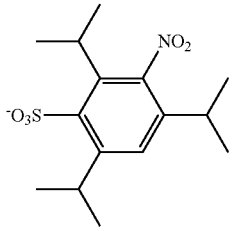
(76) 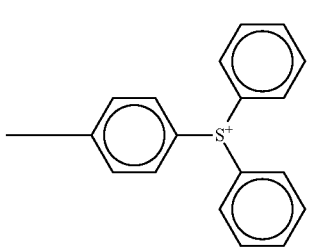

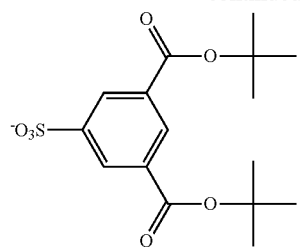
(z77)
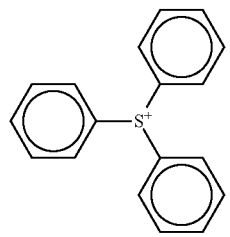
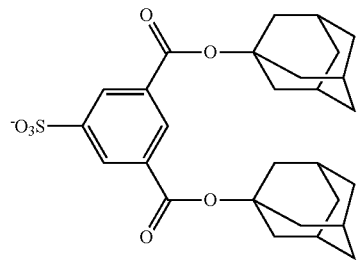
(z78)
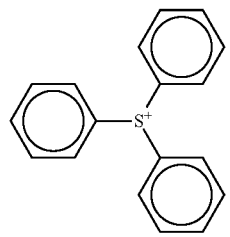
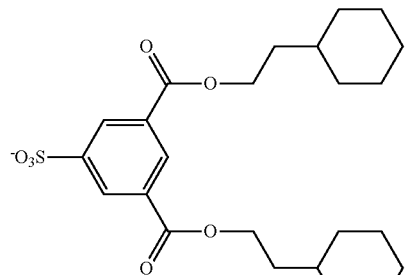
(z79)
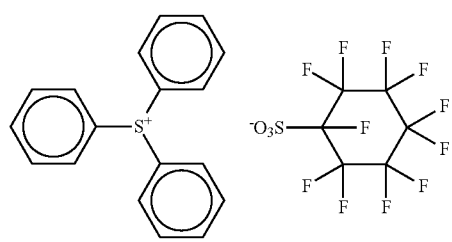
(z80)
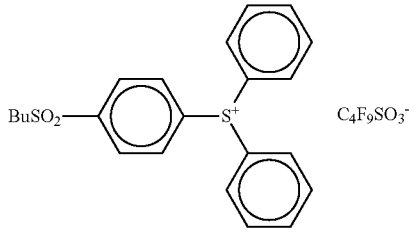
(z81)
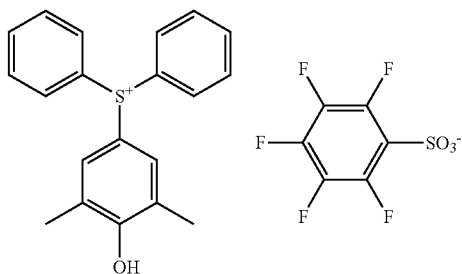
(z82)
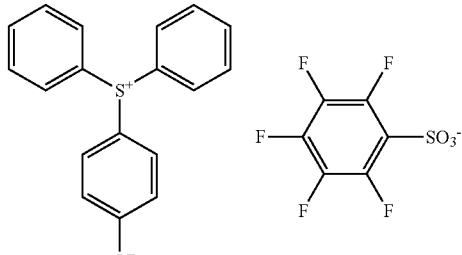
(z83)
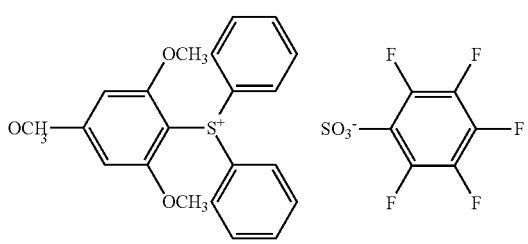
(z84)
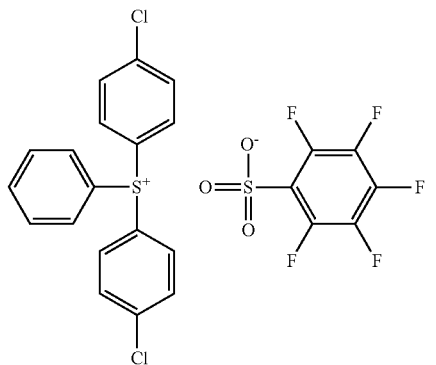

-continued (z85) 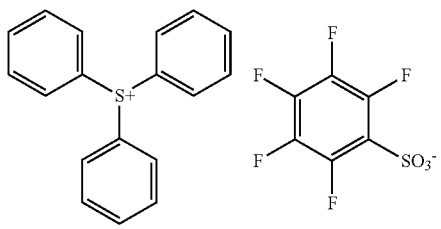

(z86) 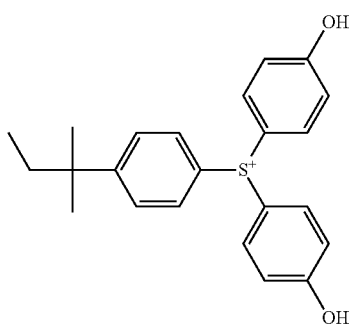

(z87) 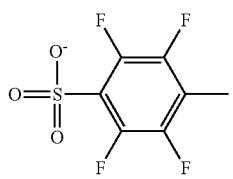

(z88) 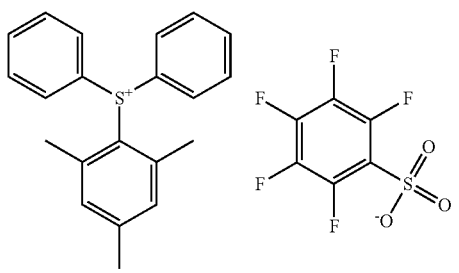

(z89) 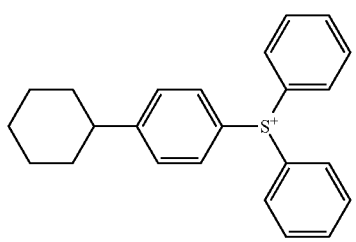

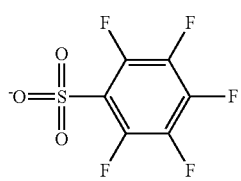

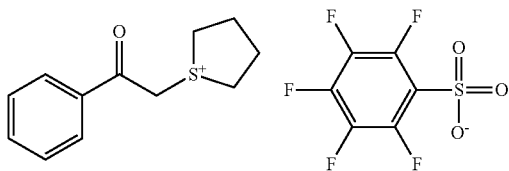

-continued (z90) 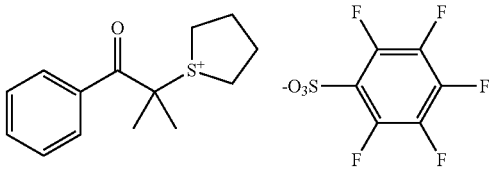

One of these acid generators may be used alone, or two or more kinds thereof may be used in combination. In the case of using two or more kinds in combination, compounds capable of generating two or more kinds of organic acids differing in the total number of atoms except for hydrogen atom by 2 or more are preferably combined.

The content of the acid generator in the composition is preferably from 0.1 to 20 mass %, more preferably from 0.5 to 10 mass %, still more preferably from 1 to 7 mass %, based on the entire solid content of the negative resist composition.

[4] Quaternary Ammonium Salt Represented by Formula (2) (component (D))

The alkyl group, alkenyl group, aryl group and aralkyl group as $R_3$ to $R_6$ in formula (2) each may have a substituent. Also, two or more groups out of $R_3$ to $R_6$ may combine to form an alicyclic or aromatic ring.

$R_3$ to $R_6$ each is preferably a linear or branched alkyl group having a carbon number of 1 to 30, a linear or branched alkenyl group having a carbon number of 1 to 30, an aryl group having a carbon number of 6 to 18, an aralkyl group having a carbon number of 7 to 18, or a group comprising a combination of these groups.

These groups each may have a substituent, and examples of the substituent include the same as those of the substituent of $R_1$ in formula (1), and a hydroxyl group. Furthermore, these groups each may have therein a linking group such as ether group, ester group and amide group.

$R_3$ to $R_6$ each is more preferably a linear or branched alkyl group having a carbon number of 1 to 25, or a linear or branched alkenyl group having a carbon number of 1 to 25, still more preferably a linear or branched alkyl group having a carbon number of 1 to 20.

In the $R_7$—$CO_2^-$ group and $R_7$—$SO_3^-$ group as B$^-$, $R_7$ preferably represents a linear or branched alkyl group having a carbon number of 1 to 8, a linear or branched alkenyl group having a carbon number of 1 to 8, an aryl group having a carbon number of 6 to 18, or an aralkyl group having a carbon number of 7 to 18.

B$^-$ is preferably an OH group, a halogen atom (e.g., chlorine, bromine, iodine, fluorine), or an $R_7$—$CO_2^-$ group (wherein $R_7$ is preferably an alkyl group having a carbon number of 1 to 12, more preferably from 1 to 6), more preferably an OH group, a halogen atom (e.g., chlorine, bromine, iodine, fluorine, or an $R_7$—$CO_2^-$ group (wherein $R_7$ is an alkyl group having a carbon number of 1 to 4).

Specific preferred examples of the component (D) are set forth below, but the present invention is not limited thereto.

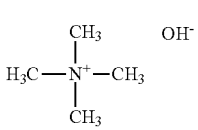

D-1

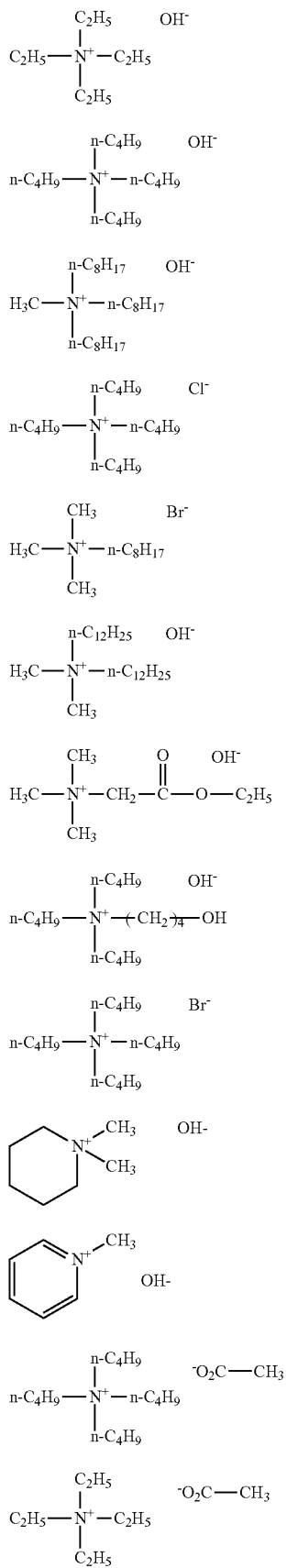
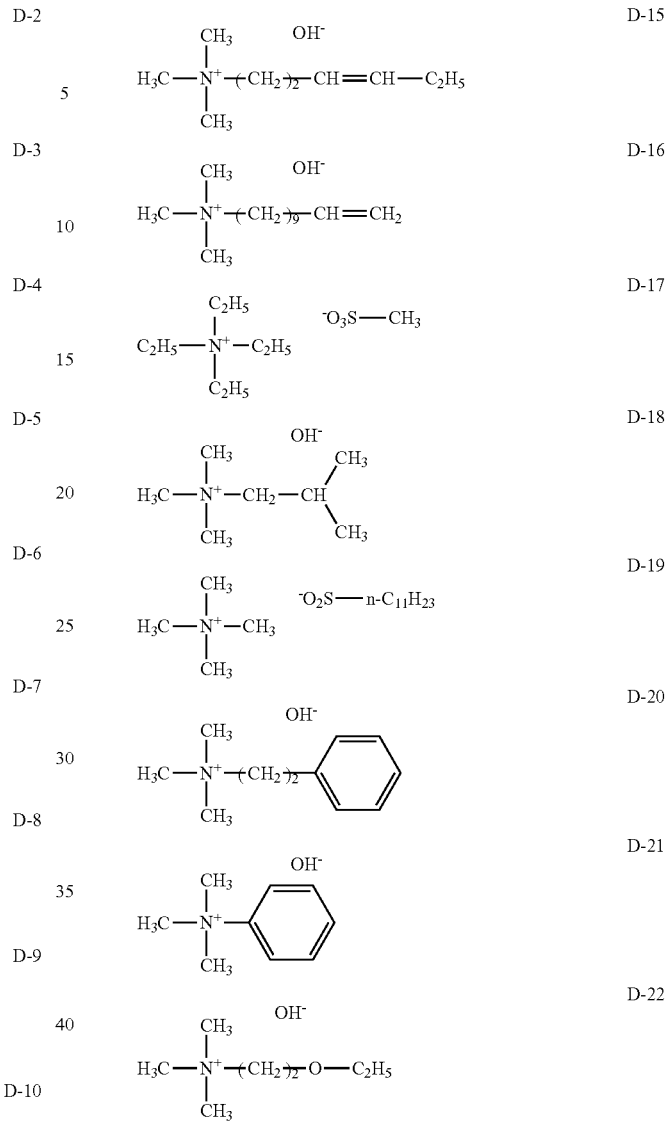

The content of the component (D) for use in the present invention is preferably from 0.01 to 10 mass %, more preferably from 0.03 to 5 mass %, still more preferably from 0.05 to 3 mass %, based on the solid content of the entire negative resist composition.

In the present invention, one of the quaternary ammonium salts as the component (D) may be used alone, or two or more kinds thereof may be mixed and used.

[5] Organic Carboxylic Acid (Component (E))

The organic carboxylic compound as the component (E) is not particularly limited and, for example, a saturated or unsaturated aliphatic carboxylic acid, an alicyclic carboxylic acid, an oxycarboxylic acid, an alkoxycarboxylic acid, a ketocarboxylic acid, and an aromatic carboxylic acid all may be used. Examples thereof include a monovalent or polyvalent aliphatic carboxylic acid such as formic acid, acetic acid, propionic acid, butyric acid, isobutyric acid, oxalic acid, malonic acid, succinic acid, glutaric acid and adipic acid, an alicyclic carboxylic acid such as 1,1-cyclohexanedicarboxylic acid, 1,2-cyclohexane-dicarboxylic acid, 1,3-cyclohexanedicarboxylic acid, 1,4-cyclohexanedicarboxylic acid and 1,1-cyclohexyldiacetic acid, an unsaturated aliphatic carboxylic acid such as acrylic acid, crotonic acid, isocrotonic acid, 3-butenoic acid, methacrylic acid, 4-pentenoic acid, propiolic acid, 2-butenoic acid, maleic acid, fumaric acid and acetylene carboxylic acid, an oxycarboxylic acid such as oxyacetic acid, an alkoxycarboxylic acid such as methoxyacetic acid and ethoxyacetic acid, a ketocarboxylic acid such as pyruvic acid, a benzoic acid, a p-hydroxybenzoic acid, an o-hydroxybenzoic acid, a 2-hydroxy-3-nitrobenzoic acid, a 3,5-dinitrobenzoic acid, a 2-nitrobenzoic acid, a 2,4-dinitrobenzoic acid, a 2,5-dinitrobenzoic acid, a 2,6-dinitrobenzoic acid, a 3,5-dinitrobenzoic acid, a 2-vinylbenzoic acid, a 4-vinylbenzoic acid, a phthalic acid, a terephthalic acid, an isophthalic acid, a 2-naphthoic acid, a 1-hydroxy-2-naphthoic acid, and a 2-hydroxy-3-naphthoic acid. In the present invention, at the time of forming a pattern by using an electron beam in vacuum, the organic carboxylic acid may vaporize from the resist film surface to contaminate the imaging chamber, and for this reason, the preferred compound is an organic carboxylic acid having an aromatic. Above all, for example, a benzoic acid, a 1-hydroxy-2-naphthoic acid and a 2-hydroxy-3-naphthoic acid are more preferred.

One of these organic carboxylic acids may be use alone, or two or more kinds thereof may be used in combination.

The amount of the organic carboxylic acid (E) blended is preferably from 0.01 to 10 parts by mass, more preferably from 0.01 to 5 parts by mass, still more preferably from 0.01 to 3 parts by mass, per 100 parts by mass of the alkali-soluble polymer (A).

Also, the blending ratio between the quaternary ammonium salt as the component (D) and the organic carboxylic acid as the component (E) is preferably (D)/(E)=5 to 95/95 to 5 (by mass), more preferably (D)/(E)=10 to 90/90 to 10 (by mass).

The negative resist composition of the present invention may further contain, if desired, a known compound such as nitrogen-containing organic basic compound, dye, surfactant, photolyzable base compound and photo-base generator. Examples of these compounds include respective compounds described in JP-A-2002-6500.

Also, examples of the solvent for use in the negative resist composition of the present invention include solvents described similarly in JP-A-2002-6500.

Preferred examples of the solvent include ethylene glycol monoethyl ether acetate, cyclohexanone, 2-heptanone, propylene glycol monomethyl ether, propylene glycol monomethyl ether acetate, propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethyl-formamide, γ-butyrolactone, N,N-dimethylacetamide, propylene carbonate and ethylene carbonate. One of these solvents may be used alone, or some may be used in combination.

The solid materials of the resist composition preferably dissolve in the solvent described above to a solid material concentration of 1 to 40 mass %, more preferably from 1 to 30 mass %, still more preferably from 3 to 20 mass %.

The negative resist composition of the present invention is coated on a substrate to form a thin film. The thickness of this coated film is preferably from 0.05 to 4.0 μm.

In the present invention, a commercially available inorganic or organic antireflection film may be used, if desired. Furthermore, an antireflection film may be used by coating it on the resist upper layer. As for this antireflection film, the antireflection film described in JP-A-2002-6500 may be used.

The use mode of the negative resist composition of the present invention is described below.

For example, in the production of a precision integrated circuit device, the step of forming a pattern on a resist film comprises coating the negative resist composition of the present invention directly on a substrate (for example, a silicon/silicon dioxide film, a glass substrate, a metal substrate, a silicon nitride substrate, a titanium nitride substrate or a chromium oxide substrate) or on an antireflection film previously provided by coating on the substrate, irradiating the coated film with radiation or actinic rays from a light source directly or through a mask, and subjecting the resist film to heating, development, rinsing and drying, whereby a good resist pattern can be formed. In the present invention, the substrate is preferably a substrate except for silicon (bare silicon), more preferably a substrate having provided on the surface thereof a metal deposition film or a metal-containing film, still more preferably a substrate on which surface a vapor deposition film by Cr, Mo, MoSi, TaSi or an oxide or nitride thereof or a film containing Cr, Mo, MoSi, TaSi or an oxide or nitride thereof is provided, yet still more preferably a substrate on which surface a vapor deposition film by Cr, MoSi, TaSi or an oxide or nitride thereof is provided.

The light source is preferably a light source emitting light at a wavelength of 150 to 250 nm (specifically, a KrF excimer laser (248 nm), an ArF excimer laser (193 nm), or an F2 excimer laser (157 nm)), an electron beam or an X-ray. In the present invention, a device using an exposure light source emitting an electron beam or an X-ray is most preferred.

The developer used for the negative resist composition of the present invention may be a known developer, and examples thereof include a developer described in JP-A-2002-6500.

EXAMPLES

The present invention is described in greater detail below by referring to Examples, but the present invention should not be construed as being limited thereto.

1. Synthesis Example of Constituent Material (1) Alkali-Soluble Polymer (Component A)

Synthesis Example 1

Synthesis of Resin (29)

4-Acetoxystyrene (3.9 g (0.024 mol)) and 0.8 g (0.006 mol) of 4-methoxystyrene were dissolved in 30 ml of 1-methoxy-2-propanol, and under stirring in a nitrogen stream, 70 ml of a 1-methoxy-2-propanol solution containing 50 mg of 2,2'-azobis(2,4-dimethylvaleronitrile) (V-65, trade name, produced by Wako Pure Chemical Industries, Ltd.) as a polymerization initiator, 9.1 g (0.056 mol) of 4-acetoxystyrene and 1.9 g (0.014 mol) of 4-methoxystyrene was added dropwise thereto at 70° C. over 2 hours. After 2 hours, 50 mg of the initiator was added, and the reaction was further allowed to proceed for 2 hours. Thereafter, the temperature was raised to 90° C., and the stirring was continued for 1 hour. The obtained reaction solution was allowed to cool and then poured into 1 liter of ion-exchanged water with vigorous stirring to precipitate a white resin. The resin obtained was dried and then dissolved in 100 ml of methanol and after adding 25% tetramethylammonium hydroxide to hydrolyze the acetoxy group in the resin, the resulting solution was neutralized with an aqueous hydrochloric acid solution to precipitate a white resin. This resin was washed with ion-exchanged water and dried under reduced pressure to obtain 11.6 g of Resin (29) of the present invention. The obtained resin was measured for the molecular weight by GPC and found to have a weight average molecular weight (Mw, in terms of polystyrene) of 9,200 and a dispersity (Mw/Mn) of 2.0.

The polymers as the component (A) for use in the present invention were synthesized in the same manner.

(2) Synthesis of Crosslinking Agent (Component B)

Synthesis of (HM-1):

1-[α-Methyl-α-(4-hydroxyphenyl)ethyl]-4-[α,α-bis(4-hydroxyphenyl)ethyl]benzene (Trisp-PA manufactured by Honshu Chemical Industry Co., Ltd.) (20 g) was added to an aqueous 10% potassium hydroxide solution and dissolved with stirring, and while stirring this solution, 60 ml of an aqueous 37% formalin solution was gradually added thereto at room temperature over 1 hour. After further stirring at room temperature for 6 hours, the solution was poured into an aqueous dilute sulfuric acid solution, and the precipitate formed was collected by filtration, thoroughly washed with water and then recrystallized from 30 ml of methanol to obtain 20 g of white powder of Hydroxymethyl Group-Containing Phenol Derivative [HM-1] having a structure shown below. The purity was 92% (as determined by a liquid chromatography method).

[HM-1]

Synthesis of (MM-1):

Hydroxymethyl Group-Containing Phenol Derivative [HM-1} (20 g) obtained in Synthesis Example above was added to liter of methanol and dissolved under heating with stirring. Subsequently, 1 ml of concentrated sulfuric acid was added to the resulting solution, and the mixture was refluxed under heating for 12 hours. After the completion of reaction, the reaction solution was cooled, and 2 g of potassium carbonate was added thereto. This mixture was sufficiently concentrated, and 300 ml of ethyl acetate was added thereto. The resulting solution was washed with water and then concentrated to dryness to obtain 22 g of a white solid of Methoxymethyl Group-Containing Phenol Derivative [MM-1] having a structure shown below. The purity thereof was 90% (as determined by a liquid chromatography method).

[MM-1]

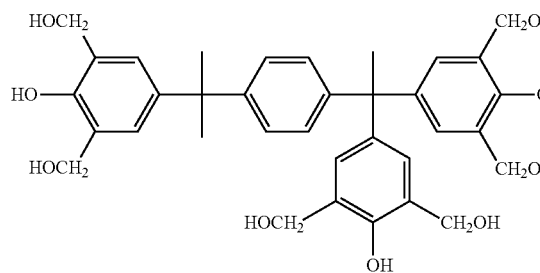

Furthermore, the phenol derivatives shown below were synthesized in the same manner.

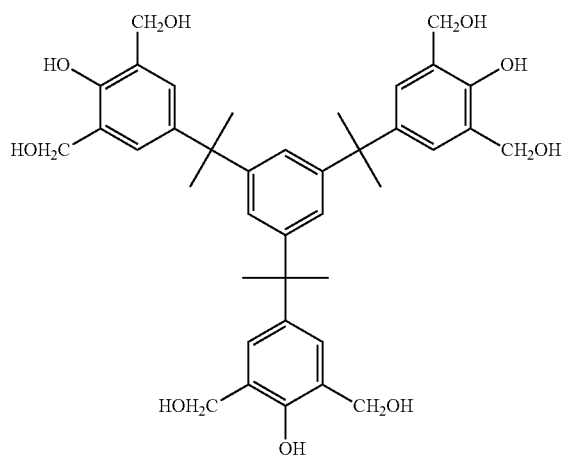

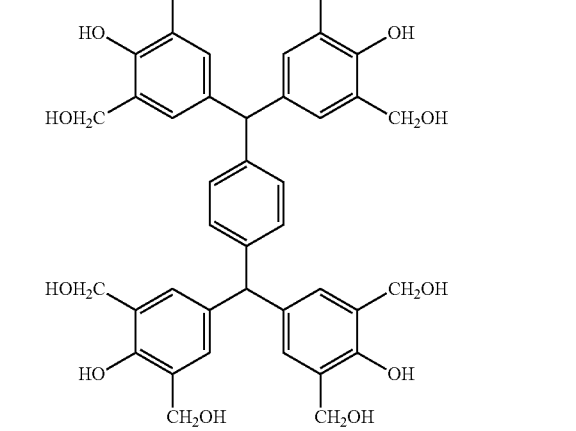

-continued

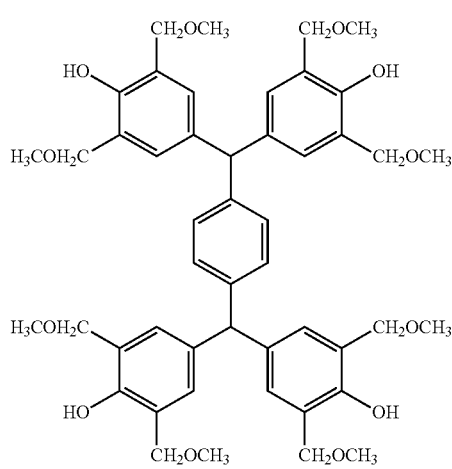

(MM-3)

2. Examples

Example 1

(1) Preparation and Coating of Negative Resist Coating Solution

| (Composition of Negative Resist Coating Solution) | |
|---|---|
| Component (A): Resin (29) | 0.40 g |
| Component (B): Crosslinking Agent MM-1 | 0.12 g |
| Component (C): Acid Generator C-1 | 0.05 g |
| Component (D): Ammonium Salt D-1 | 0.002 g |
| Component (E): Organic Carboxylic Acid E-1 | 0.012 g |

The coating solution composition above was dissolved in 9.0 g of propylene glycol monomethyl ether acetate, and 0.001 g of PF6320 (produced by OMNOVA, hereinafter simply referred to as "W-1") as a surfactant was added thereto and dissolved. The obtained solution was microfiltered through a membrane filter having a pore size of 0.1 μm to obtain a resist solution.

This resist solution was coated using a spin coater, Mark 8, manufactured by Tokyo Electron Ltd. on a 6-inch wafer having thereon Cr oxide vapor-deposited by the same processing as the shielding film used for a photomask, and dried at 110° C. for 90 seconds on a hot plate to obtain a resist film having a thickness of 0.3 μm.

(2) Production of Negative Resist Pattern

This resist film was subjected to pattern irradiation using an electron beam imaging device (HL750 manufactured by Hitachi, Ltd., accelerating voltage: 50 KeV). After the irradiation, the resist film was heated at 120° C. for 90 seconds on a hot plate, dipped in an aqueous 2.38 mass % tetramethylammonium hydroxide (TMAH) solution for 60 seconds, rinsed with water for 30 seconds and dried. The obtained pattern was evaluated for the sensitivity, resolving power, pattern profile and line edge roughness by the following methods.

(2-1) Sensitivity

The cross-sectional profile of the pattern obtained was observed by using a scanning electron microscope (5-4300, manufactured by Hitachi, Ltd.), and the exposure dose necessary for resolving a 0.15-μm line (line:space=1:1) was defined as the sensitivity.

(2-2) Resolving Power

The limiting resolving power (the line and space were separated and resolved) at the exposure dose giving the sensitivity above was defined as the resolving power.

(2-3) Pattern Profile

The cross-sectional profile of a 0.15-μm line pattern at the exposure dose giving the sensitivity above was observed by a scanning electron microscope (S-4300, manufactured by Hitachi, Ltd.) and rated on a three-point scale of rectangular, slightly eroded, and eroded.

(2-4) Line Edge Roughness

The line width was measured at arbitrary 30 points in the region of 50 μm in the longitudinal direction of a 0.15-μm line pattern at the irradiation dosage giving the sensitivity above, and the variation thereof was evaluated by 3σ.

(2-5) In-Vacuum PED Characteristics

The wafer was set in a vacuum chamber and irradiated with an electron beam at the irradiation dose giving the sensitivity above, and immediately or 3 hours after the irradiation, the wafer was baked (heat-treated) at 120° C. for 90 seconds and then developed as described above to obtain a line pattern.

With respect to the 0.15-μm line pattern obtained by performing the baking and development immediately after the irradiation of an electron beam and the 0.15-μm line pattern obtained by performing the baking and development 3 hours after the irradiation of an electron beam, the line width was measured through a scanning electron microscope (S-9220, manufactured by Hitachi Ltd.), and the difference therebetween was defined as the in-vacuum PED characteristic.

The results in Example 1 were good, that is, sensitivity: 6.0 μC/cm², resolving power: 0.11 μm, pattern profile: rectangular, line edge roughness: 6.0 nm, and in-vacuum PED characteristic: 2.0 nm.

Examples 2 to 16

Preparation of the resist solution and formation of the negative pattern were performed in the same manner as in Example 1 except for using respective components shown in Table 1 below. In Table 1, the ratio in using two or more kinds for a component is the ratio by mass. The evaluation results are shown in Table 2.

Comparative Example 1

Preparation of the resist solution and formation of the negative pattern were performed in the same manner as in Example 1 except for, as shown in Table 1, not using an organic carboxylic acid as the component (E). The evaluation results are shown in Table 2.

Comparative Example 2

Preparation of the resist solution and formation of the negative pattern were performed in the same manner as in Example 1 except that, as shown in Table 1, a novolak resin not having a repeating unit of formula (1) was used for the resin as the component (A). The evaluation results are shown in Table 2.

Comparative Examples 3 and 4

Preparation of the resist solution and formation of the negative pattern were performed in the same manner as in Example 1 except for, as shown in Table 1, using only a known nitrogen-containing organic basic compound without using a quaternary ammonium salt as the component (D). The evaluation results are shown in Table 2.

TABLE 1

| Example | Resin as Component (A) (0.40 g) | Cross-linking Agent as Component (B) | Acid Generator as Component (C) | Ammonium Salt as Component (D) | Other Components | Organic Carboxylic Acid as Component (E) | Solvent (9.0 g) | Surfactant (0.001 g) |
|---|---|---|---|---|---|---|---|---|
| 1 | (29) Mw = 9200 x/y = 80/20 Mw/Mn = 2.0 | MM-1 0.12 g | C-1 0.05 g | D-1 0.002 g | | E-1 0.012 g | S-1 | W-1 |
| 2 | (2) Mw = 5000 Mw/Mn = 1.18 | MM-1 0.12 g | C-1 0.05 g | D-1 0.002 g | | E-3 0.012 g | S-1/S-2 = 80/20 | W-1 |
| 3 | (1) Mw = 2500 Mw/Mn = 1.15 | MM-2 0.11 g | C-2 0.05 g | D-3 0.003 g | | E-3 0.012 g | S-1 | W-1 |
| 4 | (2) Mw = 7000 Mw/Mn = 1.3 | MM-3 0.12 g | C-3 0.05 g | D-10 0.004 g | | E-3 0.012 g | S-1 | W-2 |
| 5 | (27) Mw = 3500 x/y = 85/15 Mw/Mn = 1.2 | MM-1 0.12 g | C-2 0.05 g | D-1 0.002 g | F-2 0.002 g | E-1 0.012 g | S-1/S-2 = 80/20 | W-1 |
| 6 | (25) Mw = 5000 x/y = 60/40 Mw/Mn = 1.1 | MM-3 0.12 g | C-2/C-4 = 50/50 0.05 g | D-12 0.006 g | | E-3 0.012 g | S-2 | W-1 |
| 7 | (32) Mw = 7500 x/y = 80/20 Mw/Mn = 1.6 | MM-1 0.12 g | C-2 0.05 g | D-2 0.002 g | F-1 0.002 g | E-2 0.012 g | S-1/S-2 = 80/20 | W-2 |
| 8 | (2) Mw = 5000 Mw/Mn = 1.18 | CL-1 0.12 g | C-4 0.05 g | D-2 0.002 g | | E-4 0.012 g | S-1 | W-1 |
| 9 | (2) Mw = 5000 1.1/ (1) Mw = 2500 1.1 = 75/25 | MM-1 0.12 g | C-2/C-3 = 50/50 0.05 g | D-1 0.002 g | | E-3 0.024 g | S-1/S-2 = 80/20 | W-1 |
| 10 | (58) Mw = 3500 x/y = 80/20 Mw/Mn = 2.0 | MM-1 0.12 g | C-4 0.06 g | D-1 0.002 g | | E-1 0.012 g | S-1/S-2 = 80/20 | W-1 |
| 11 | (2) Mw = 5000 Mw/Mn = 1.18 | MM-1 0.12 g | C-1 0.05 g | D-1 0.002 g | | E-1 0.012 g | S-1/S-2 = 80/20 | W-1 |
| 12 | (25) Mw = 5000 x/y = 60/40 Mw/Mn = 1.1 | MM-1 0.08 g | Z-85 0.04 g | D-1 0.002 g | | E-1 0.012 g | S-1/S-2 = 80/20 | W-2 |
| 13 | (1) Mw = 2500 Mw/Mn = 1.15 (2) Mw = 5000 Mw/Mn = 1.18 (1)/(2) = 25/75 (by mass) | MM-1 0.08 g | Z-85 0.04 g | D-1 0.002 g | | E-2 0.012 g | S-1/S-2 = 80/20 | W-2 |
| 14 | (1) Mw = 2500 Mw/Mn = 1.15 (2) Mw = 5000 Mw/Mn = 1.18 (1)/(2) = 25/75 (by mass) | MM-1 0.08 g | Z-87 0.02 g Z-88 0.02 g | D-1 0.002 g | | E-1 0.012 g | S-1/S-2 = 80/20 | W-2 |
| 15 | (1) Mw = 2500 Mw/Mn = 1.15 (2) Mw = 5000 Mw/Mn = 1.18 (1)/(2) = 25/75 (by mass) | MM-1 0.08 g | Z-87 0.02 g Z-88 0.02 g | D-1 0.002 g | | E-1 0.012 g | S-1/S-2 = 80/20 | W-2 |
| 16 | (1) Mw = 2500 Mw/Mn = 1.15 (2) Mw = 5000 Mw/Mn = 1.18 (1)/(2) = 25/75 (by mass) | MM-1 0.08 g | Z-88 0.04 g | D-1 0.002 g | | E-1 0.012 g | S-1/S-2 = 80/20 | W-2 |

| Comparative Example | Resin (0.40 g) | Cross-linking Agent as Component (B) | Acid Generator as Component (C) | Ammonium Salt or Comparative Compound | Other Components | Organic Carboxylic Acid as Component (E) | Solvent (9.0 g) | Surfactant (0.001 g) |
|---|---|---|---|---|---|---|---|---|
| 1 | (29) Mw = 9200 x/y = 80/20 Mw/Mn = 2.0 | MM-1 0.12 g | C-1 0.05 g | D-1 0.002 g | | | S-1 | W-1 |
| 2 | Novolak Resin AG-2B (produced by Gun Ei Chemical Industry Co., Ltd.) | MM-1 0.12 g | C-1 0.05 g | D-1 0.002 g | | E-1 0.012 g | S-1 | W-1 |

TABLE 1-continued

| | | | | | | | |
|---|---|---|---|---|---|---|---|
| 3 | (25) Mw = 5000<br>x/y = 60/40<br>Mw/Mn = 1.1 | MM-1<br>0.12 g | C-4<br>0.06 g | F-3<br>0.004 g | E-1<br>0.012 g | S-1 | W-1 |
| 4 | (29) Mw = 9200<br>x/y = 80/20<br>Mw/Mn = 2.0 | MM-1<br>0.12 g | C-1<br>0.05 g | G-1<br>0.002 g | E-1<br>0.012 g | S-1 | W-1 |

*When a mixed solvent is used, the values in the Table indicate the mass ratio.

The abbreviations in the Table are described below.
(Crosslinking Agent)

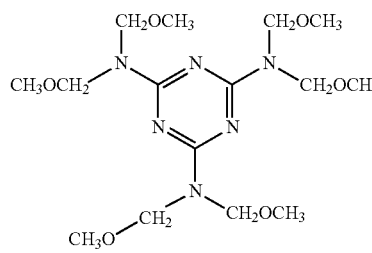

CL-1

The acid generators used in Table 1 are as follows.
C-1: Triphenylsulfonium nonafluorobutanesulfonate
C-2: Triphenylsulfonium pentafluorobenzenesulfonate
C-3: Triphenylsulfonium-2,4-dimethylbenzenesulfonate
C-4: Bisphenyl-4-cyclohexylphenylsulfonium pentafluorobenzenesulfonate The organic carboxylic acids used in Table 1 are as follows.
E-1: Benzoic acid
E-2: 2-Naphthoic acid
E-3: 2-Hydroxy-3-naphthoic acid
E-4: o-Hydroxybenzoic acid Other components used in Table 1 are as follows (all produced by Tokyo Kasei Kogyo Co., Ltd.).
F-1: 2,4,5-Triphenylimidazole
F-2: 4-Dimethylaminopyridine
F-3: Triethylamine
G-1: Trimethylammonium hydrochloride The solvents used in Table 1 are as follows.
S-1: Propylene glycol monomethyl ether acetate
S-2: Propylene glycol monomethyl ether The surfactants used in Table 1 are as follows.
W-1: PF6320 (produced by OMNOVA)
W-2: Megafac F176 (produced by Dainippon Ink & Chemicals, Inc.)

TABLE 2

| | Sensitivity ($\mu C/cm^2$) | Resolving Power ($\mu m$) | Pattern Profile (rating on 3-stage scale) | Line Edge Roughness (nm) | In-Vacuum FED Characteristic (nm) |
|---|---|---|---|---|---|
| Example | | | | | |
| 1 | 6.0 | 0.11 | rectangular | 6.0 | 2.0 |
| 2 | 5.0 | 0.10 | rectangular | 5.0 | 1.7 |
| 3 | 6.0 | 0.12 | rectangular | 6.0 | 2.0 |
| 4 | 7.0 | 0.12 | rectangular | 6.5 | 1.8 |
| 5 | 5.0 | 0.10 | rectangular | 5.5 | 1.5 |
| 6 | 6.0 | 0.13 | rectangular | 7.0 | 1.6 |
| 7 | 7.0 | 0.12 | rectangular | 6.5 | 1.5 |
| 8 | 6.0 | 0.14 | rectangular | 7.0 | 1.9 |
| 9 | 5.0 | 0.10 | rectangular | 5.0 | 1.6 |
| 10 | 5.0 | 0.10 | rectangular | 5.0 | 1.8 |
| 11 | 7.0 | 0.14 | rectangular | 6.5 | 1.9 |
| 12 | 7.0 | 0.12 | rectangular | 6.5 | 2.0 |
| 13 | 6.0 | 0.10 | rectangular | 6.0 | 1.8 |
| 14 | 5.0 | 0.10 | rectangular | 5.5 | 1.7 |
| 15 | 6.0 | 0.11 | rectangular | 6.0 | 1.6 |
| 16 | 5.0 | 0.11 | rectangular | 6.0 | 1.8 |

TABLE 2-continued

| | Sensitivity ($\mu C/cm^2$) | Resolving Power ($\mu m$) | Pattern Profile (rating on 3-stage scale) | Line Edge Roughness (nm) | In-Vacuum FED Characteristic (nm) |
|---|---|---|---|---|---|
| Comparative Example | | | | | |
| 1 | 6.0 | 0.22 | eroded | 7.0 | 2.3 |
| 2 | 10.0 | 0.20 | slightly eroded | 12.5 | 8.6 |
| 3 | 8.0 | 0.18 | slightly eroded | 10.5 | 5.6 |
| 4 | 9.0 | 0.18 | slightly eroded | 11.5 | 4.3 |

It is seen from Table 2 that the negative resist composition of the present invention is excellent in terms of sensitivity, resolving power, pattern profile, line edge roughness and in-vacuum PED characteristic and assured of good performance.

According to the present invention, a negative resist composition excellent in terms of sensitivity, resolving power, pattern profile, line edge roughness and in-vacuum PED characteristic, and a pattern forming method using the composition can be provided.

The entire disclosure of each and every foreign patent application from which the benefit of foreign priority has been claimed in the present application is incorporated herein by reference, as if fully set forth.

What is claimed is:
1. A coated product comprising a substrate on which surface a vapor deposition film is provided and a layer directly set on the vapor deposition film,
wherein the vapor deposition film is formed of Cr, Mo, MoSi, TaSi or an oxide or nitride thereof, and
wherein the layer directly set on the vapor deposition film contains a negative resist composition, comprising:
(A) an alkali-soluble polymer containing a repeating unit represented by formula (1);
(B) a crosslinking agent capable of crosslinking with the alkali soluble polymer (A) under an action of an acid;
(C) a compound capable of generating an acid upon irradiation with actinic rays or radiation;
(D) a quaternary ammonium salt represented by formula (2); and
(E) an aromatic carboxylic acid:
Formula (1):

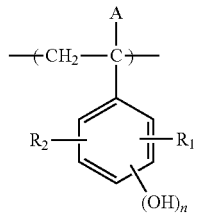

wherein A represents a hydrogen atom, an alkyl group, a halogen atom or a cyano group;

$R_1$ and $R_2$ each independently represents a hydrogen atom, a halogen atom, an alkyl group, an alkenyl group, a cycloalkyl group, an aryl group, an aralkyl group, an alkoxy group or an alkylcarbonyloxy group; and n represents an integer of 1 to 3;

Formula (2)

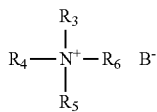

wherein $R_3$ to $R_6$ each independently represents an alkyl group, an alkenyl group, an aryl group or an aralkyl group;

$B^-$ represents an $OH^-$ group, an $R_7$—$CO_2^-$ group or an $R_7$—$SO_3^-$ group; and $R_7$ represents an alkyl group, an alkenyl group, an aryl group or an aralkyl group;

wherein a blending ratio between the quaternary ammonium salt (D) and the aromatic carboxylic acid (E) is (D)/(E)=10 to 90/90 to 10 (by mass); and wherein the aromatic carboxylic acid (E) is a benzoic acid.

2. The coated product according to claim 1, wherein the crosslinking agent (B) is a phenol compound having two or more benzene rings within a molecule thereof and not containing a nitrogen atom.

3. The coated product according to claim 1, wherein the alkali-soluble polymer (A) further contains at least one repeating unit selected from the repeating units represented by formulae (3), (4) and (5):

Formula (3)

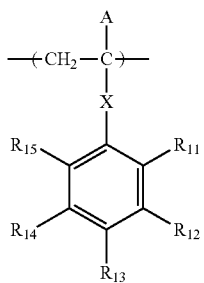

Formula (4)

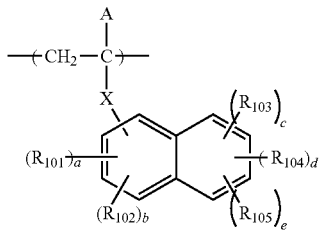

Formula (5)

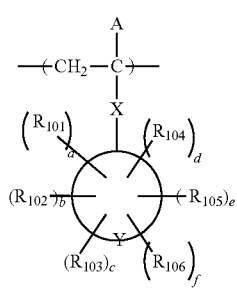

represents any group selected from the following structures:

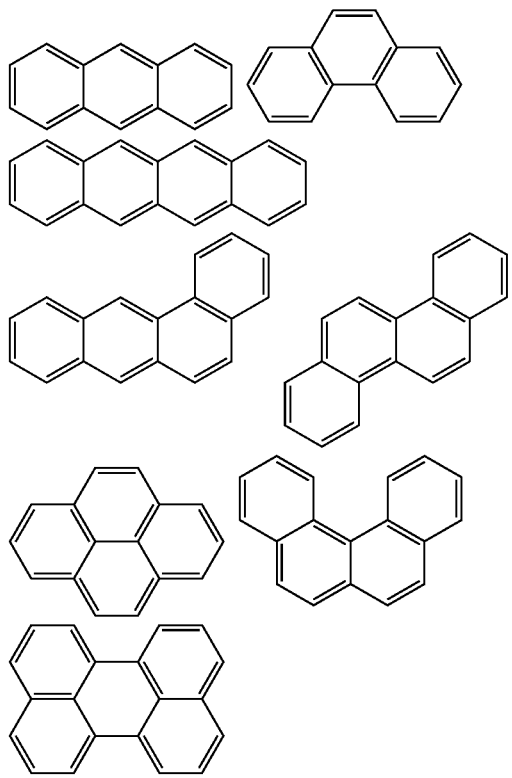

wherein A has the same meaning as A in formula (1);

X represents a single bond, a —COO— group, an —O— group or a —CON($R_{16}$)— group;

$R_{16}$ represents a hydrogen atom or an alkyl group;

$R_{11}$ to $R_{15}$ each independently has the same meaning as $R_1$ in formula (1);

$R_{101}$ to $R_{106}$ each independently represents a hydroxy group, a halogen atom, an alkyl group, an alkoxy group, an alkylcarbonyloxy group, an alkylsulfonyloxy group, an alkenyl group, an aryl group, an aralkyl group or a carboxy group; and a to f each independently represents an integer of 0 to 3.

4. The coated product according to claim 1, wherein the crosslinking agent (B) is a phenol derivative having a molecular weight of 1,200 or less, containing from 3 to 5 benzene rings within a molecule thereof, and having two or more hydroxymethyl groups or alkoxymethyl groups in total, the two or more hydroxymethyl groups or alkoxymethyl groups being bonded to at least any one benzene ring in a concentrated manner or distributed among the benzene rings.

5. The coated product according to claim 1, which is for exposure using an electron beam.

6. The coated product according to claim 1, wherein, in formula (2), $B^-$ represents an $OH^-$ group or an $R_7$—$CO_2^-$ group.

7. The coated product according to claim 1, wherein the vapor deposition film is formed of Cr oxide.

8. The coated product according to claim 1, wherein the substrate is not composed of only silicon.

9. The coated product according to claim 1, wherein the compound (C) capable of generating an acid upon irradiation with actinic rays or radiation is a compound represented by the following Formula (ZI):

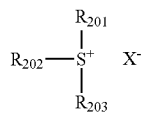

wherein $R_{201}$, $R_{202}$ and $R_{203}$ each independently represents an organic group and $X^-$ represents a non-nucleophilic anion selected from the group comprising of sulfonate anion, carboxylate anion, bis(alkylsulfonyl)amide anion, tris(alkylsulfonyl)methide anion, $BF_4^-$, $PF_6^-$ and $SbF_6^-$.

10. The coated product according to claim 3, wherein the alkali-soluble polymer (A) further contains a repeating unit represented by the Formula (3), wherein $R_{13}$ is an alkylcarbonyloxy group.

11. A pattern forming method, comprising:
forming a resist film from the coated product according to claim 1; and exposing and developing the resist film.

12. The pattern forming method according to claim 11, wherein the resist film is exposed by using an electron beam or an X-ray as an exposure light source.

13. The pattern forming method according to claim 12, wherein the resist film is exposed by using an electron beam as an exposure light source.

* * * * *